United States Patent
Holmes et al.

(10) Patent No.: US 11,107,966 B2
(45) Date of Patent: Aug. 31, 2021

(54) TWO-SIDED MAJORANA FERMION QUANTUM COMPUTING DEVICES FABRICATED WITH ION IMPLANT METHODS

(71) Applicant: International Business Machines Corporation, Armonk, NY (US)

(72) Inventors: Steven J. Holmes, Ossining, NY (US); Stephen W. Bedell, Wappingers Falls, NY (US); Sean Hart, Tarrytown, NY (US); Devendra K. Sadana, Pleasantville, NY (US); Ning Li, White Plains, NY (US); Patryk Gumann, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 14 days.

(21) Appl. No.: 16/680,117

(22) Filed: Nov. 11, 2019

(65) Prior Publication Data
US 2021/0143312 A1    May 13, 2021

(51) Int. Cl.
*H01L 39/10*    (2006.01)
*H01L 39/24*    (2006.01)
(Continued)

(52) U.S. Cl.
CPC .............. *H01L 39/10* (2013.01); *H01L 27/18* (2013.01); *H01L 39/24* (2013.01); *H01L 39/228* (2013.01)

(58) Field of Classification Search
CPC ....... H01L 39/10; H01L 39/14; H01L 39/145; H01L 39/146; H01L 39/22; H01L 39/228;
(Continued)

(56) References Cited

U.S. PATENT DOCUMENTS 4,631,423 A * 12/1986 Faris .................... G01R 13/342
327/186
9,559,284 B2    1/2017 Chang et al.
(Continued)

FOREIGN PATENT DOCUMENTS

WO    2019074557 A1    4/2019
WO PCT/EP2020/081643    1/2021
(Continued)

OTHER PUBLICATIONS

Karzig et al., Scalable designs for quasiparticle-poisoning-protected topological quantum computation with Majorana zero modes, Physical Review B, vol. 95, No. 23, 2017.
(Continued)

*Primary Examiner* — Scott B Geyer
(74) *Attorney, Agent, or Firm* — Garg Law Firm, PLLC; Rakesh Garg; Douglas Pearson

(57) ABSTRACT

A quantum computing device is fabricated by forming, on a superconductor layer, a first resist pattern defining a device region and a sensing region within the device region. The superconductor layer within the sensing region is removed, exposing a region of a first surface of an underlying semiconductor layer outside the device region. The exposed region of the semiconductor layer is implanted, forming an isolation region surrounding the device region. The sensing region and a portion of the device region of the superconductor layer are exposed. A sensing region contact is formed by coupling the first surface of the semiconductor layer with a first metal layer. A nanorod contact using the first metal within the portion of the device region outside the sensing region is formed. By depositing a second metal layer on a second surface of the semiconductor layer within the sensing region, a tunnel junction gate is formed.

20 Claims, 28 Drawing Sheets

(51) Int. Cl.
*H01L 27/18* (2006.01)
*H01L 39/22* (2006.01)

(58) Field of Classification Search
CPC ......... H01L 39/24; H01L 27/18; B82Y 10/00; Y10S 977/933; G06N 99/002
See application file for complete search history.

(56) References Cited

U.S. PATENT DOCUMENTS

| | | | |
|---|---|---|---|
| 9,570,563 | B2 | 2/2017 | Cohen et al. |
| 10,133,986 | B1* | 11/2018 | Newton ................. G06F 17/11 |
| 10,177,297 | B2 | 1/2019 | Marcus et al. |
| 10,593,879 | B2* | 3/2020 | Schrade ................. B82Y 10/00 |
| 2002/0180006 | A1* | 12/2002 | Franz .................... H01L 39/228 257/661 |
| 2012/0028806 | A1 | 2/2012 | Bonderson et al. |
| 2017/0161632 | A1 | 6/2017 | Freedman et al. |
| 2018/0052806 | A1 | 2/2018 | Hastings et al. |
| 2018/0053113 | A1 | 2/2018 | Lutchyn et al. |
| 2018/0053809 | A1 | 2/2018 | Freedman et al. |
| 2019/0013457 | A1 | 1/2019 | Lutchyn et al. |
| 2019/0043968 | A1 | 2/2019 | Lampert et al. |
| 2019/0043973 | A1 | 2/2019 | George et al. |
| 2019/0043989 | A1 | 2/2019 | Thomas et al. |
| 2019/0131513 | A1 | 5/2019 | Krogstrup et al. |
| 2019/0371908 | A1* | 12/2019 | Hutin ................. H01L 29/66984 |
| 2020/0027030 | A1* | 1/2020 | Freedman ........... H01L 29/0676 |
| 2020/0287120 | A1* | 9/2020 | Pikulin ............. H01L 21/02639 |
| 2020/0321508 | A1* | 10/2020 | Hart ...................... H01L 29/155 |

FOREIGN PATENT DOCUMENTS

| | | |
|---|---|---|
| WO | PCT/EP2020/081647 | 2/2021 |
| WO | PCT/EP2020/081649 | 3/2021 |

OTHER PUBLICATIONS

Dai et al., Extracting entangled qubits from Majorana fermions in quantum dot chains through the measurement of parity, Scientific Reports, vol. 5, 2015.
Shabani et al., Two-dimensional epitaxial superconductor-semiconductor heterostructures: A platform for topological superconducting networks, Physical Review B, vol. 93, No. 15, 2016.
Zhang et al., Observation of a Discrete Time Crystal, Sep. 29, 2016.
Schüffelgen et al., In-situ Fabrication of Topological-Superconducting Hybrids, IEEE/CSC & ESAS Superconductivity News Forum (global edition), 2017.
Bomantara et al., Simulation of Non-Abelian Braiding in Majorana Time Crystals, Physical Review Letters 120, Jun. 7, 2018.
Sato et al., Majorana Fermions and Topology in Superconductors, Journal of the Physical Society of Japan 85, 07200, Jun. 2, 2016, http://doi.org/10.7566/JPSJ.85.072001.
List of all IBM related dockets, Appendix P, 2019.
Chen et al., Experimental Phase Diagram of a One-Dimensional Topological Superconductor, Oct. 14, 2016.
Lyu et al., Protected gap closing in Josephson junctions constructed on Bi2Te3 surface, Sep. 11, 2018.
Van Veen et al., Observation of 2e-periodic Supercurrents in Nanowire Single-Cooper-Pair Transistors, Cornell University Library, Ithaca, NY, May 25, 2018.
Wickramasinghe et al., Transport properties of near surface InAs two-dimensional heterostructures, vol. 113, No. 26, Jan. 10, 2019.
Lutchyn et al., Realizing Majorana zero modes in superconductor-semiconductor heterostructures, Feb. 27, 2018.
Krogstrup et al., Epitaxy of semiconductor-superconductor nanowires, Nature Materials, vol. 14, No. 4, Apr. 1, 2015.
Sabonis et al., Dispersive sensing in hybrid InAs/Al nanowires, Applied Physics Letters, vol. 115, No. 10, Sep. 3, 2019.
Lawrie et al., Quantum Dot Arrays in Silicon and Germanium, Sep. 14, 2019.

* cited by examiner

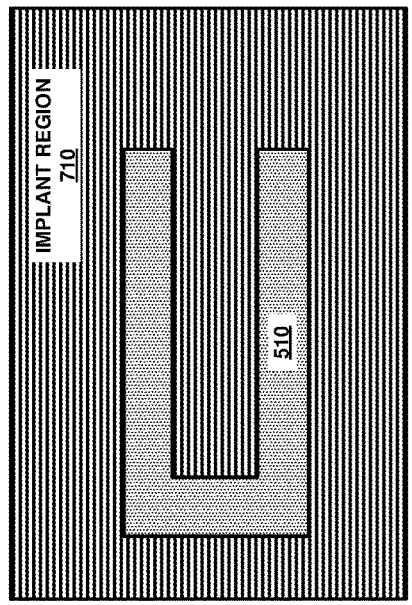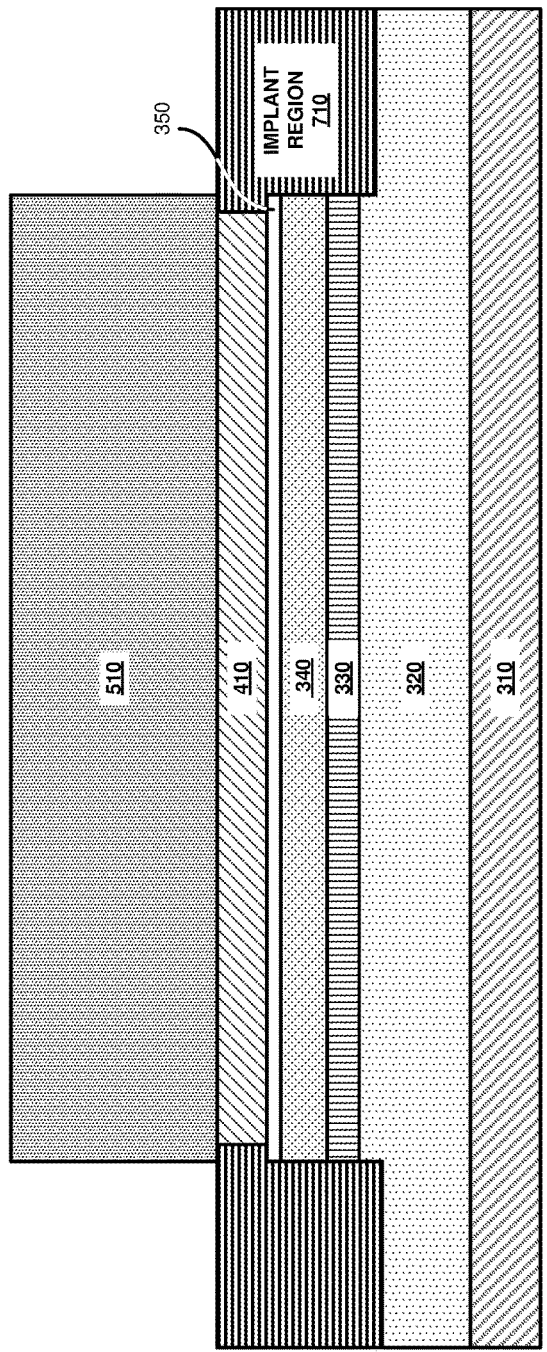
Fig. 7

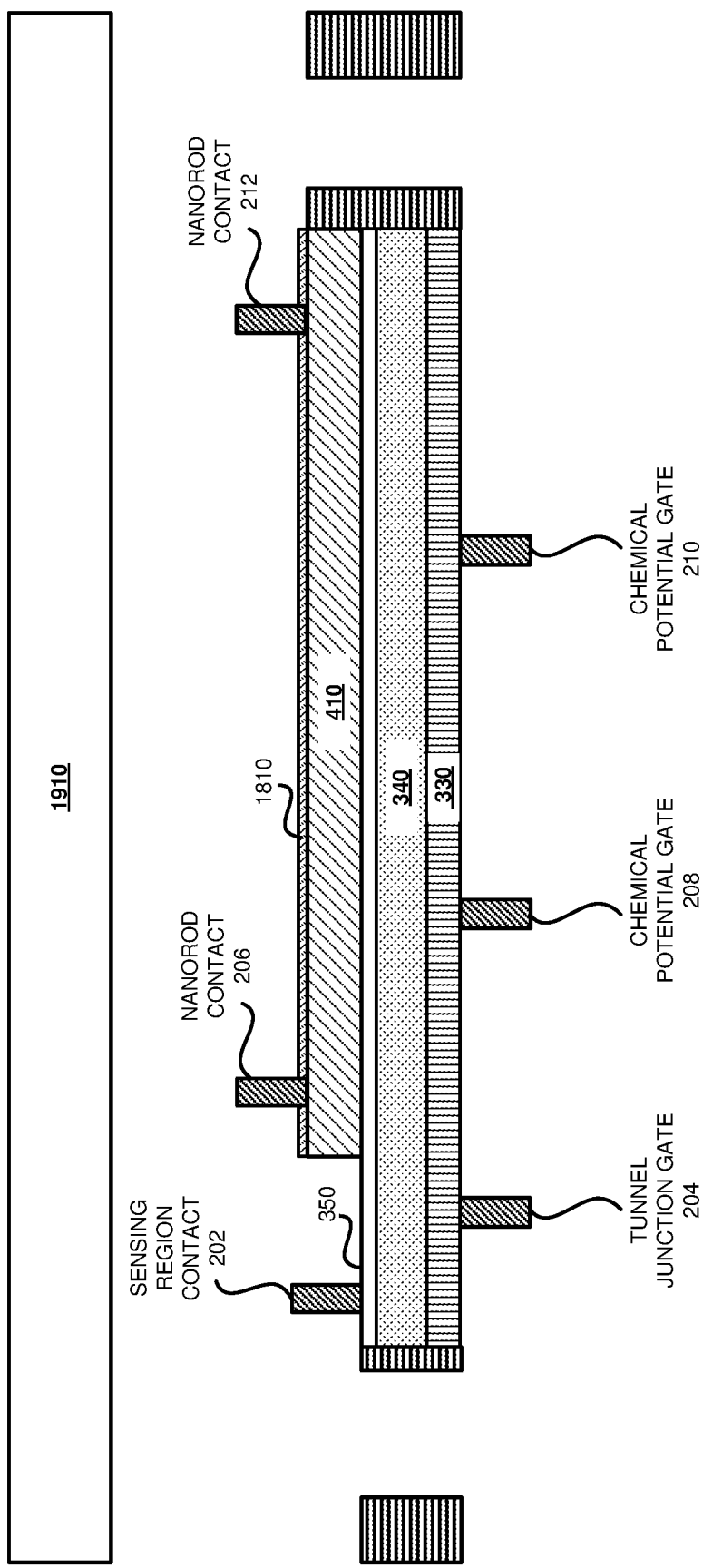

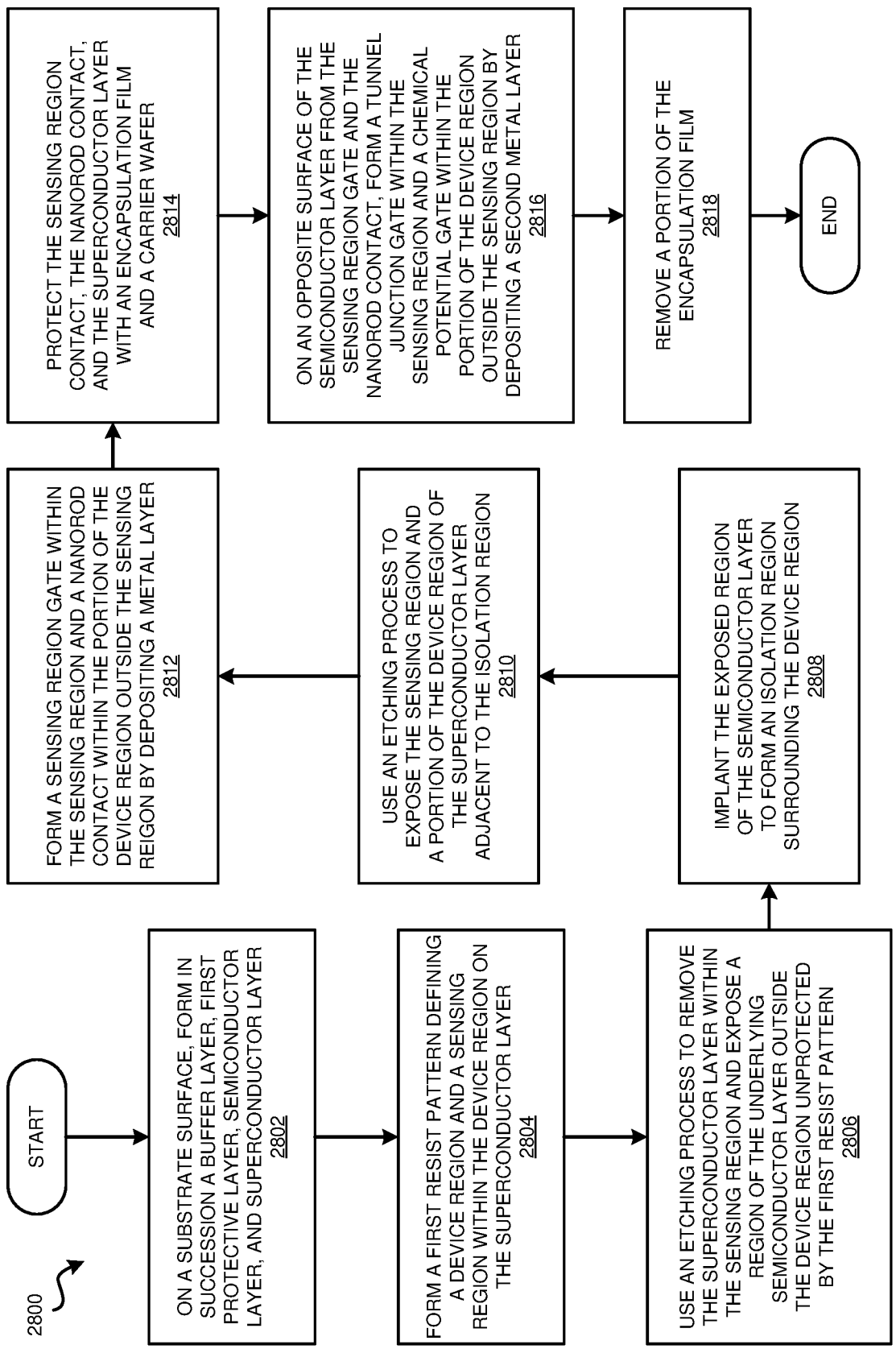

TWO-SIDED MAJORANA FERMION QUANTUM COMPUTING DEVICES FABRICATED WITH ION IMPLANT METHODS

TECHNICAL FIELD

The present invention relates generally to a superconductor device, a fabrication method, and fabrication system for superconducting quantum devices. More particularly, the present invention relates to a device, method, and system for two-sided Majorana fermion quantum computing devices fabricated with ion implant methods.

BACKGROUND

Hereinafter, a "Q" prefix in a word or phrase is indicative of a reference of that word or phrase in a quantum computing context unless expressly distinguished where used.

Molecules and subatomic particles follow the laws of quantum mechanics, a branch of physics that explores how the physical world works at a fundamental level. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

In a superconducting state, the material firstly offers no resistance to the passage of electrical current. When resistance falls to zero, a current can circulate inside the material without any dissipation of energy. Secondly, the material exhibits the Meissner effect, i.e., provided they are sufficiently weak, external magnetic fields do not penetrate the superconductor, but remain at its surface. When one or both of these properties are no longer exhibited by the material, the material is said to be in a normal state and no longer superconducting.

A critical temperature of a superconducting material is a temperature at which the material begins to exhibit characteristics of superconductivity. Superconducting materials exhibit very low or zero resistivity to the flow of current. A critical field is the highest magnetic field, for a given temperature, under which a material remains superconducting.

Superconductors are generally classified into one of two types. Type I superconductors exhibit a single transition at the critical field. Type I superconductors transition from a non-superconducting state to a superconducting state when the critical field is reached. Type II superconductors include two critical fields and two transitions. At or below the lower critical field, type II superconductors exhibit a superconducting state. Above the upper critical field, type II superconductors exhibit no properties of superconductivity. Between the upper critical field and the lower critical field, type II superconductors exhibit a mixed state. In a mixed state, type II superconductors exhibit an incomplete Meissner effect, i.e., penetration of external magnetic fields in quantized packets at specific locations through the superconductor material.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states |0> and |1>. These two states may be two energy states of atoms, for example, the ground (|g>) and first excited (|e>) state of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

Superconducting devices such as qubits are fabricated using superconducting and semiconductor materials in known semiconductor fabrication techniques. A superconducting device generally uses one or more layers of different materials to implement the device properties and function. A layer of material can be superconductive, conductive, semiconductive, insulating, resistive, inductive, capacitive, or have any number of other properties. Different layers of materials may have to be formed using different methods, given the nature of the material, the shape, size or placement of the material, other materials adjacent to the material, and many other considerations.

The software tools used for designing semiconducting and superconducting devices produce, manipulate, or otherwise work with an electrical layout and device components on very small scales. Some of the components that such a tool may manipulate may only measure few nanometers across when formed in a suitable substrate.

A layout includes shapes whose shape and position are selected in the tool according to the device's objective. Once a design layout, also referred to simply as a layout, has been finalized for a device or a group of devices, the design is converted into a set of masks or reticles. A set of masks or reticles is one or more masks or reticles. During manufacture, a semiconductor wafer is exposed to light or radiation through a mask to form microscopic components comprising the structures. This process is known as photolithography. A mask is usable for manufacturing or printing the contents of the mask onto the wafer. During the photolithographic printing process, radiation is focused through the mask and at certain desired intensity of the radiation. This intensity of the radiation combined with any materials that are deposited using the radiation is commonly referred to as "dose". The focus and the dosing of the radiation is controlled to achieve the desired shape and electrical characteristics of structures on the wafer.

A fabrication process for a semiconducting or superconducting device includes not only dosing but other methods of depositing and/or removing materials having various electrical and/or mechanical characteristics. For example, a conducting material may be deposited using a beam of ions of that material; a hard insulator may be dissolved using a chemical or eroded using mechanical planning. These examples of operations in a fabrication process are not intended to be limiting. From this disclosure, those of ordinary skill in the art will be able to conceive many other operations in a fabrication process that is usable to fabricate a device according to the illustrative embodiments, and the same are contemplated within the scope of the illustrative embodiments.

Superconducting devices are often planar, i.e., where the superconductor structures are fabricated on one plane. A non-planar device is a three-dimensional (3D) device where some of the structures are formed above or below a given plane of fabrication.

Quantum gates perform operations on qubits. Quantum gates are analogous to basic operations in classical computing, such as AND, OR, and NOT gates, and are often used as building blocks for more complex operations on qubits. Topological quantum computation is an approach to quantum computation in which quantum gates result from the braiding of anyons, a particular type of topological quantum object. Devices that implement topological quantum computation offer the possibility of longer coherence times, and hence greater fault tolerance, than conventional quantum computing devices, with similar computational capabilities to conventional quantum computing devices.

One implementation of an anyon suitable for topological quantum computation is a Majorana quasiparticle, also called a Majorana zero mode (MZM) or Majorana fermion. Thus, topological quantum computing involves manipulating MZMs and measuring their states, and a Majorana fermion quantum computing device implements MZM manipulation and state measurement.

SUMMARY

The illustrative embodiments provide a quantum computing device. An embodiment includes a device region on a superconductor layer above a first surface of a semiconductor layer. An embodiment includes a sensing region within the device region, the sensing region comprising a portion of the device region in which the superconductor layer has been removed. An embodiment includes a sensing region contact comprising a first metal coupled to the first surface of the semiconductor layer within the sensing region. An embodiment includes a nanorod contact comprising the first metal coupled to the superconductor layer within the portion of the device region outside the sensing region. An embodiment includes a tunnel junction gate comprising a second metal within the sensing region, the tunnel junction gate disposed on a second surface of the semiconductor layer An embodiment includes a chemical potential gate comprising the second metal within a portion of the device region outside the sensing region, the chemical potential gate disposed on the second surface of the semiconductor layer.

An embodiment includes a method to fabricate a quantum computing device. An embodiment includes a fabrication system for fabricating the quantum computing device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 7 depicts a block diagram of an example configuration reached in the fabrication of a Majorana fermion quantum computing device in accordance with an illustrative embodiment;

FIG. 27 depicts a block diagram of an example configuration reached in the fabrication of a Majorana fermion quantum computing device in accordance with an illustrative embodiment; and FIG. 28 depicts a flowchart of an example process for fabricating a Majorana fermion quantum computing device in accordance with an illustrative embodiment.

DETAILED DESCRIPTION

The illustrative embodiments recognize that, while devices that implement topological quantum computation are desirable, there are difficulties in fabricating such devices. For Majorana fermion quantum computing devices to function correctly, films and interfaces between device layers must be above a particularly high quality threshold, but conventional device processing techniques such as reactive-ion etching (RIE), cleaning processes, and air oxidation tend to damage films and layer surfaces, reducing quality below that threshold. In addition, if dielectric films are used to separate structures, trapped charges in dielectric films can produce quasiparticles, resulting in uncontrolled electron densities that can quench qubit coherence. Further, multiple structures, including semiconductor and superconductor components, regions used to measure MZM state, gates, contacts, and wires must be integrated into one device. Therefore, the illustrative embodiments recognize that there is an unmet need to fabricate Majorana fermion quantum computing devices using techniques that produce sufficiently high quality films and surfaces, avoid damaging RIE and cleaning processes, and avoid using dielectric films. In addition, the illustrative embodiments recognize that the process flow used to fabricate Majorana fermion quantum computing devices should have as few masking steps as possible, for efficient fabrication. Further, the illustrative embodiments recognize that arranging device gates and contacts on two sides of a device improves wiring routing among devices.

The illustrative embodiments used to describe the invention generally address and solve the above-described problems or needs and other related problems or needs by providing two-sided Majorana fermion quantum computing devices fabricated with ion implant methods. The illustrative embodiments also provide a novel fabrication method for fabricating two-sided Majorana fermion quantum computing devices fabricated with ion implant methods. The illustrative embodiments also provide a system for fabricating two-sided Majorana fermion quantum computing devices fabricated with ion implant methods. In particular, the illustrative embodiments provide for growing semiconductor and superconductor structures in situ, using known epi processes for III-V quantum wells, to generate both high quality films and interfaces between films. The illustrative embodiments provide for using low dose ion implant to define circuit regions, thus avoiding damaging RIE and clean processes, and to alter film conductivities, thus avoiding the use of dielectric films. In addition, mild wet etch is used to remove superconductor from needed regions, and mild lift off patterning is used to form wiring structures.

Figure 1:
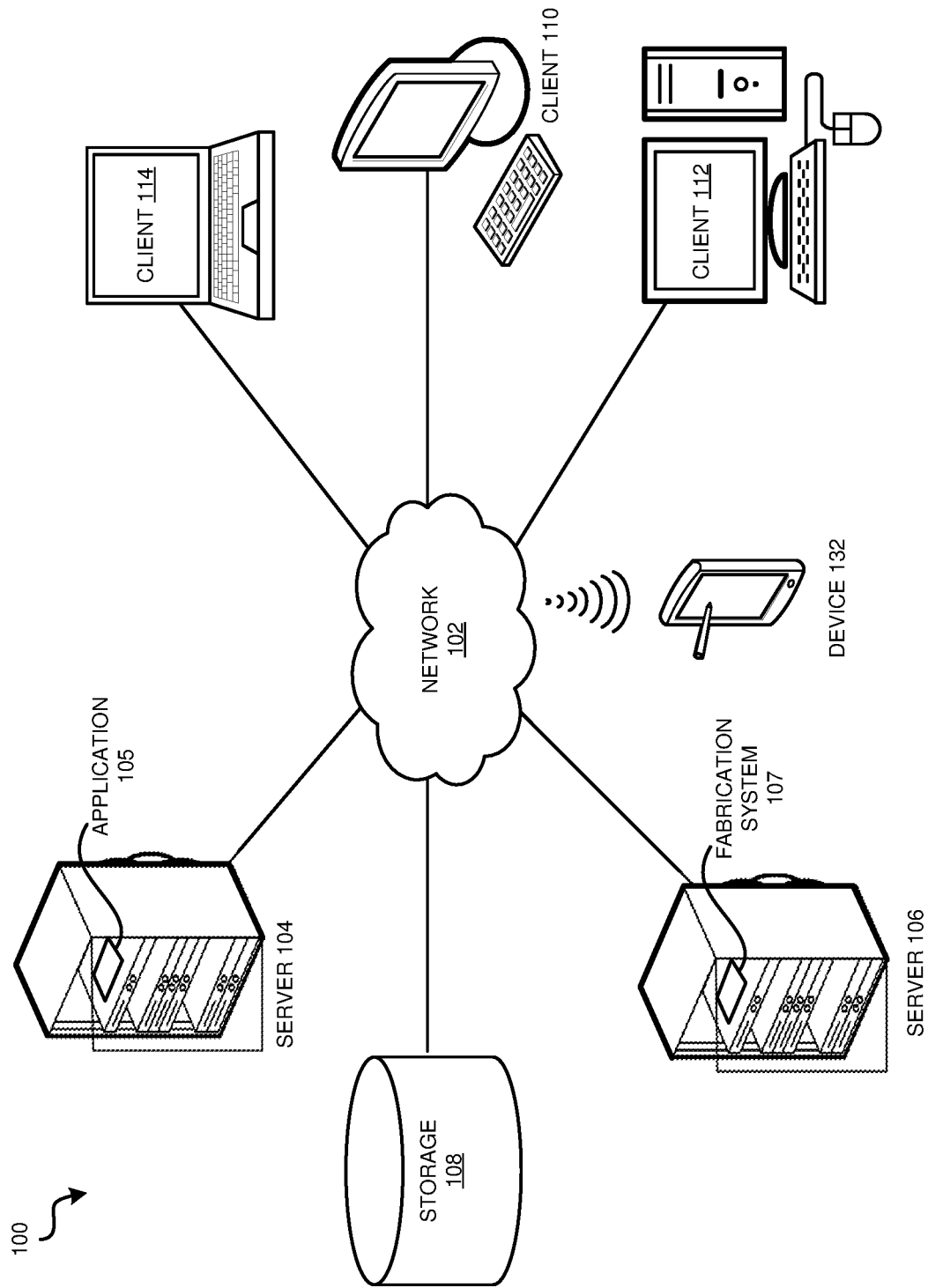
FIG. 1 depicts a block diagram of a network of data processing systems in which illustrative embodiments may be implemented.

With reference to the figures and in particular with reference to FIG. 1, these figures are example diagrams of data processing environments in which illustrative embodiments may be implemented. FIG. 1 is only an example and is not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Device 132 is an example of a mobile computing device. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is a software component of any suitable system for fabricating a quantum device. Generally, fabrication systems and their corresponding software components for manufacturing superconducting devices, including devices for quantum computing usage, are known. Application 105 provides instructions to such a known fabrication system via fabrication application 107 for causing the assembly of a novel two-sided Majorana fermion quantum computing device fabricated with ion implant methods contemplated in the illustrative embodiments, in a manner described herein.

An embodiment provides for a two-sided Majorana fermion quantum computing device fabricated with ion implant methods in accordance with an illustrative embodiment. The device includes a superconductor layer above a semiconductor layer, a sensing region, and a sensing region contact within the sensing region and a nanorod contact outside the sensing region, both disposed on a first surface of the device. The device also includes a tunnel junction gate within the sensing region and a chemical potential gate outside the sensing region, both disposed on a second surface of the device. The device is surrounded by an isolation region.

An embodiment provides for a novel design and fabrication method of a two-sided Majorana fermion quantum computing device fabricated with ion implant methods in accordance with an illustrative embodiment. In the embodiment, a design/fabrication system designs and fabricates a two-sided Majorana fermion quantum computing device fabricated with ion implant methods.

Another embodiment provides a fabrication method for a two-sided Majorana fermion quantum computing device fabricated with ion implant methods, such that the method can be implemented as a software application. The application implementing a fabrication method embodiment can be configured to operate in conjunction with an existing superconducting fabrication system—such as a lithography system.

For the clarity of the description, and without implying any limitation thereto, the illustrative embodiments are described using an example number of Majorana fermion manipulation and measurement structures arranged on a substrate. An embodiment can be implemented with a different number of structures, different structure arrangements, a superconducting device other than a qubit formed using the structures, or other types of quantum computing devices, or some combination thereof, within the scope of the illustrative embodiments.

Furthermore, a simplified diagram of the example structures is used in the figures and the illustrative embodiments. In an actual fabrication of a Majorana fermion quantum computing device, additional structures that are not shown or described herein, or structures different from those shown and described herein, may be present without departing the scope of the illustrative embodiments. Similarly, within the scope of the illustrative embodiments, a shown or described structure in the example device may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, numerosity, or some combination thereof, are chosen only for the clarity of the drawings and the description and may have been exaggerated, minimized, or otherwise changed from actual shape, location, position, or dimension that might be used in actual lithography to achieve an objective according to the illustrative embodiments.

Furthermore, the illustrative embodiments are described with respect to a specific actual or hypothetical superconducting device, e.g., a qubit that is presently viable, only as an example. The steps described by the various illustrative embodiments can be adapted for fabricating a variety of quantum computing devices in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, thermal properties, structures, formations, shapes, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
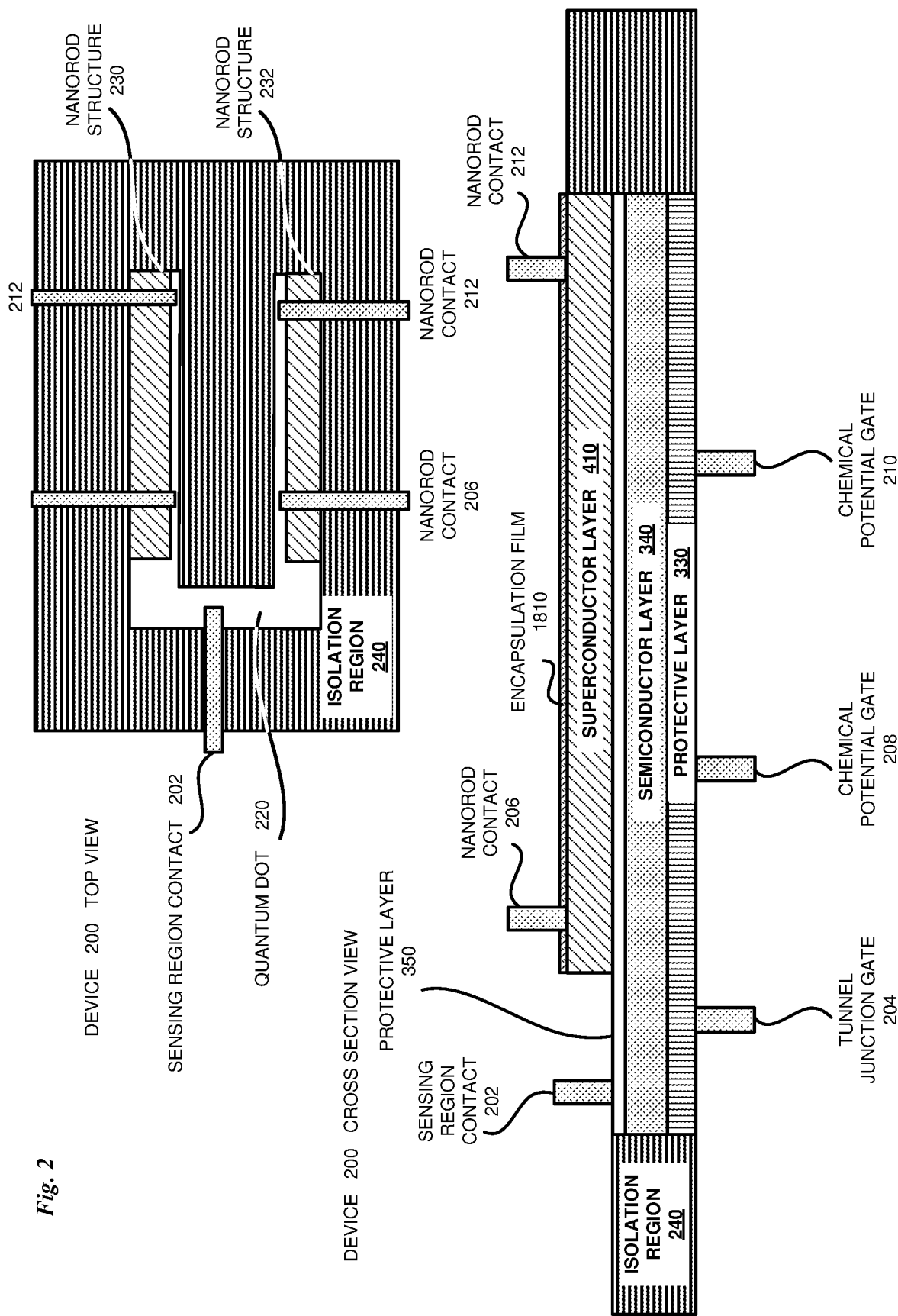
FIG. 2 depicts a two-sided Majorana fermion quantum computing device fabricated with ion implant methods in accordance with an illustrative embodiment.

With reference to FIG. 2, this figure depicts a two-sided Majorana fermion quantum computing device fabricated with ion implant methods in accordance with an illustrative embodiment.

In particular, FIG. 2 depicts top and cross section views of device 200. Device 200 is a Majorana fermion quantum computing device fabricated with ion implant methods in accordance with an illustrative embodiment. Device 200 includes at least two nanorod structures 230 and 232, configured as one superconducting island surrounded by isolation region 240. Nanorod structures 230 and 232 are both connected to a sensing region. In one embodiment, nanorod structures 230 and 232 are substantially parallel to each other, and connected to a sensing region at one end of each of nanorod structures 230 and 232. In another embodiment, nanorod structures 230 and 232 are substantially perpendicular to each other. In another embodiment, nanorod structures 230 and 232 meet at an angle. Each nanorod structure includes a semiconductor portion of semiconductor layer 340 with a surface covered by protective layer 350 and a superconducting portion of superconductor layer 410).

Each nanorod structure has dimensions appropriate to enable the nanowire to act as a one-dimensional topological superconductor, with a chemical potential and magnetic field adjusted so that the nanorod hosts an MZM at each end when the metal in the superconducting portions of nanorod structures 230 and 232 is caused to become superconducting—e.g. by reducing the temperature of the metal to a specified cryogenic temperature—and device 200 is operational. In particular, layers 330 and 350 assist in confining charge carriers inside layer 340, which acts as a type of quantum well. In one embodiment, each nanorod structure is 200 nanometers wide and 1 micrometer long, although smaller dimensions and different width-length ratios are also possible and contemplated within the scope of the illustrative embodiments.

Using MZMs in a quantum computing device requires the ability to perform parity measurements of MZM pairs. The illustrative embodiments perform MZM parity measurements using a quantum dot based measurement scheme. In particular, quantum dot 220, part of a sensing region of device 200, is a semiconducting wire that is connected to one end of each of nanorod structures 230 and 232. Using tunnel junction gate 204 to control amplitudes for electrons to tunnel between quantum dot 220 and the MZMs in nanorod structures 230 and 232, quantum dot 220 can be selectively coupled to nanorod structures 230 and 232. When MZM state is not being measured, all couplings are turned off, leaving the MZM island and the quantum dot with fixed charges. In the decoupled state, environmental noise, which couples to charge, has no effect on the MZMs. Thus, unless a measurement is in progress, noise cannot measure, and hence collapse, the qubit state. To measure MZM state, the tunnel junction gate is activated, inducing an energy shift observable using for example, quantum dot charge.

Sensing region contact 202 is coupled to quantum dot 220 and is used to sense electron density in the quantum dot. Nanorod contacts 206 and 212 are coupled to the superconductor portion of nanorod structure 230 and are used to route electrical current through the superconductor portion of nanorod structures, imparting superconductivity to the surface of the semiconductor portion of nanorod structures to make device 200 function. Chemical potential gates 208 and 210 are used to adjust nanorod chemical potential so that the nanorod hosts an MZM at each end. Tunnel junction gate 204 also includes a dielectric portion coupled to the superconductor portion and a metal portion coupled to dielectric portion, and is used to pinch off nanorod conductivity during device operation. Together, sensing region contact 202, tunnel junction gate 204, and quantum dot 220 comprise a sensing region of device 200.

Figure 3:
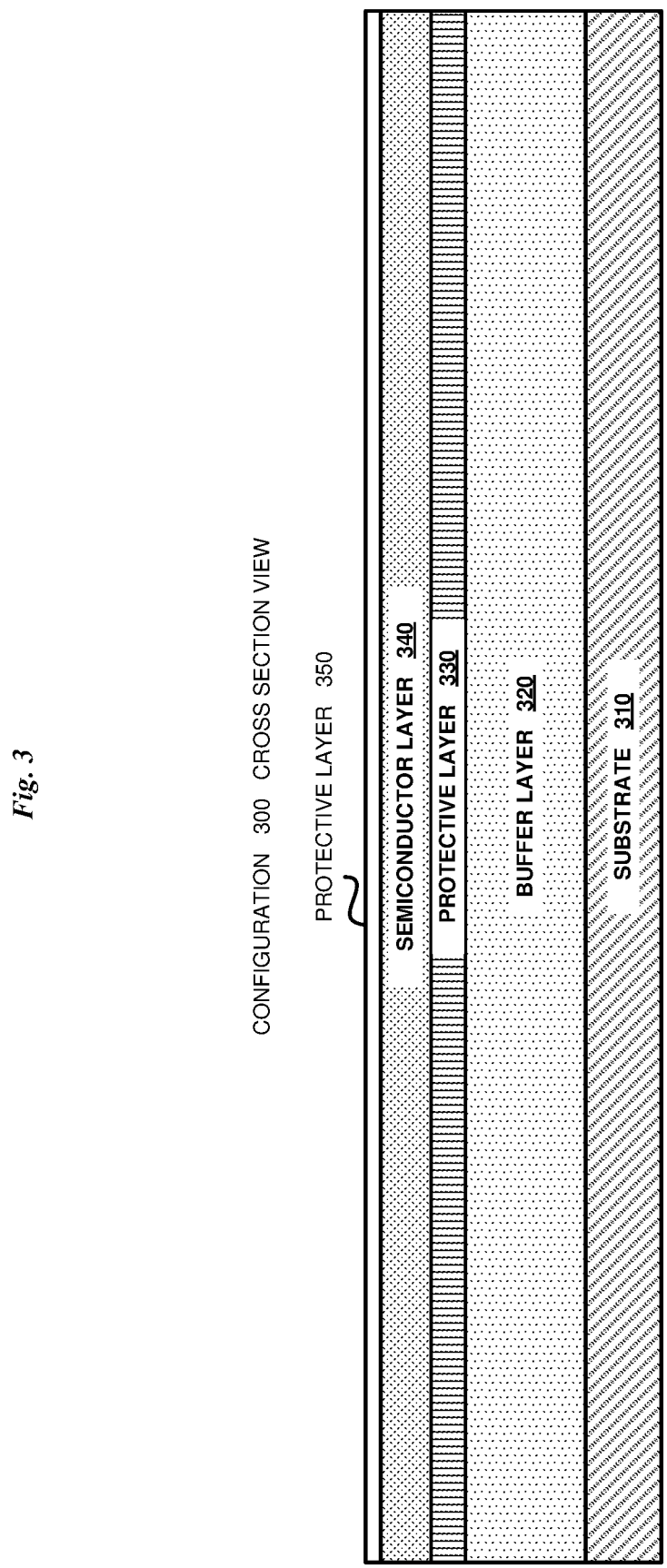
FIG. 3 depicts a block diagram of an example configuration reached in the fabrication of a Majorana fermion quantum computing device in accordance with an illustrative embodiment.

With reference to FIG. 3, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 300 as described herein. Semiconductor layer 340 and protective layer 350 are the same as semiconductor layer 340 and protective layer 350 in FIG. 2.

Substrate 310 comprises a material, which when operating in a cryogenic temperature range, exhibits a Residual Resistance Ratio (RRR) of at least 100, and a thermal conductivity of greater than a 1 W/(cm*K) at 4 Kelvin. RRR is the ratio of the resistivity of a material at room temperature and at 0 K. Because 0 K cannot be reached in practice, an approximation at 4 K is used. For example, substrate 310 may be formed using sapphire, silicon, quartz, gallium arsenide (GaAs), fused silica, amorphous silicon, indium phosphide (InP), or diamond for operations in the temperature range of 77 K to 0.01K. These examples of substrate materials are not intended to be limiting. From this disclosure those of ordinary skill in the art will be able to conceive of many other materials suitable for forming substrate 310 and the same are contemplated within the scope of the illustrative embodiments.

An embodiment causes the fabrication system to epitaxially grow buffer layer 320, an epitaxial semiconductor, on substrate 310. Material for buffer layer 320 is selected based on the composition of substrate 310 and protective layer 330. In one embodiment, buffer layer 320 is formed of indium aluminum arsenide (InAlAs), to match the crystal lattice of adjacent protective layer 330, In one embodiment, buffer layer 320 has a gradual change in composition from substrate 310 to protective layer 330 to avoid creating crystal defects—e.g. dislocations—in protective layer 330. In one embodiment, the gradual change in composition is a linear change. For example, if substrate 310 comprises GaAs and protective layer 330 comprises InAs, growing a sufficiently high quality layer of InAs directly on the GaAs of substrate 310 is difficult. Thus, buffer layer 320 begins at substrate 310 with GaAs, and the gallium is gradually replaced with indium to eventually match the InAs of protective layer 330. These examples of materials are not intended to be limiting. From this disclosure those of ordinary skill in the art will be able to conceive of many other materials suitable for forming buffer layer 320 and the same are contemplated within the scope of the illustrative embodiments.

An embodiment causes the fabrication system to epitaxially grow protective layer 330, an epitaxial semiconductor, on buffer layer 320. Materials for protective layers 330 and 350 are selected based on the composition of semiconductor layer 340, to provide crystal quality above a particular quality threshold. In an embodiment using InAs in a one-to-one ratio for semiconductor layer 340, indium gallium arsenide (InGaAs) using a 0.8 In to 1 Ga to 0.2 As ratio is used for protective layers 330 and 350. In an embodiment using indium gallium arsenide (InGaAs) using a 0.7 In to 1 Ga to 0.3 As ratio for semiconductor layer 340, indium gallium arsenide (InGaAs) using a 0.53 In to 1 Ga to 0.47 As ratio or a 0.52 In to 1 Ga to 0.48 As ratio is used for protective layers 330 and 350. In an embodiment using InSb for semiconductor layer 340, In0.80-0.90Al0.1-0.2Sb (InAlSb using a 1 In to 0.8-0.9 Al to 0.1-0.2 Sb ratio) is used for protective layers 330 and 350. In an embodiment using InP as a substrate, protective layer 330 is lattice matched to the InP of substrate 310. However, protective layers 330 and 350 need not be formed of the same material. In addition, protective layer 350 is not required. These examples of materials are not intended to be limiting. From this disclosure those of ordinary skill in the art will be able to conceive of many other materials suitable for forming protective layers 330 and 350 and the same are contemplated within the scope of the illustrative embodiments. In one embodiment, protective layer 330 is approximately 4 nm thick, although a thicker or thinner layer is also possible and contemplated within the scope of the illustrative embodiments.

An embodiment causes the fabrication system to epitaxially grow semiconductor layer 340 on protective layer 330. In embodiments, semiconductor layer 340 is formed of indium arsenide (InAs) using a one-to-one In:As ratio, indium gallium arsenide (InGaAs) using a 0.7 In to 1 Ga to 0.3 As ratio, or indium antimony (InSb). These examples of substrate materials are not intended to be limiting. From this disclosure those of ordinary skill in the art will be able to conceive of many other materials suitable for forming substrate 310 and the same are contemplated within the scope of the illustrative embodiments. In one embodiment, semiconductor layer 340 is approximately 7 nm thick, although a thicker or thinner layer is also possible and contemplated within the scope of the illustrative embodiments.

An embodiment causes the fabrication system to epitaxially grow protective layer 350, an epitaxial semiconductor, on semiconductor layer 340. In one embodiment, protective layer 350 is approximately 5 nm thick, although a thicker or thinner layer is also possible and contemplated within the scope of the illustrative embodiments. Protective layers 330 and 350 protect surfaces of semiconductor layer 340 from damage during fabrication. A damaged portion of semiconductor layer 340 could degrade device properties. Thus, if the risk of damage during fabrication is sufficiently low, protective layer 350 may not necessary over the quantum dot structure. In addition, protective layers 330 and 350 need not be the same material.

Figure 4:
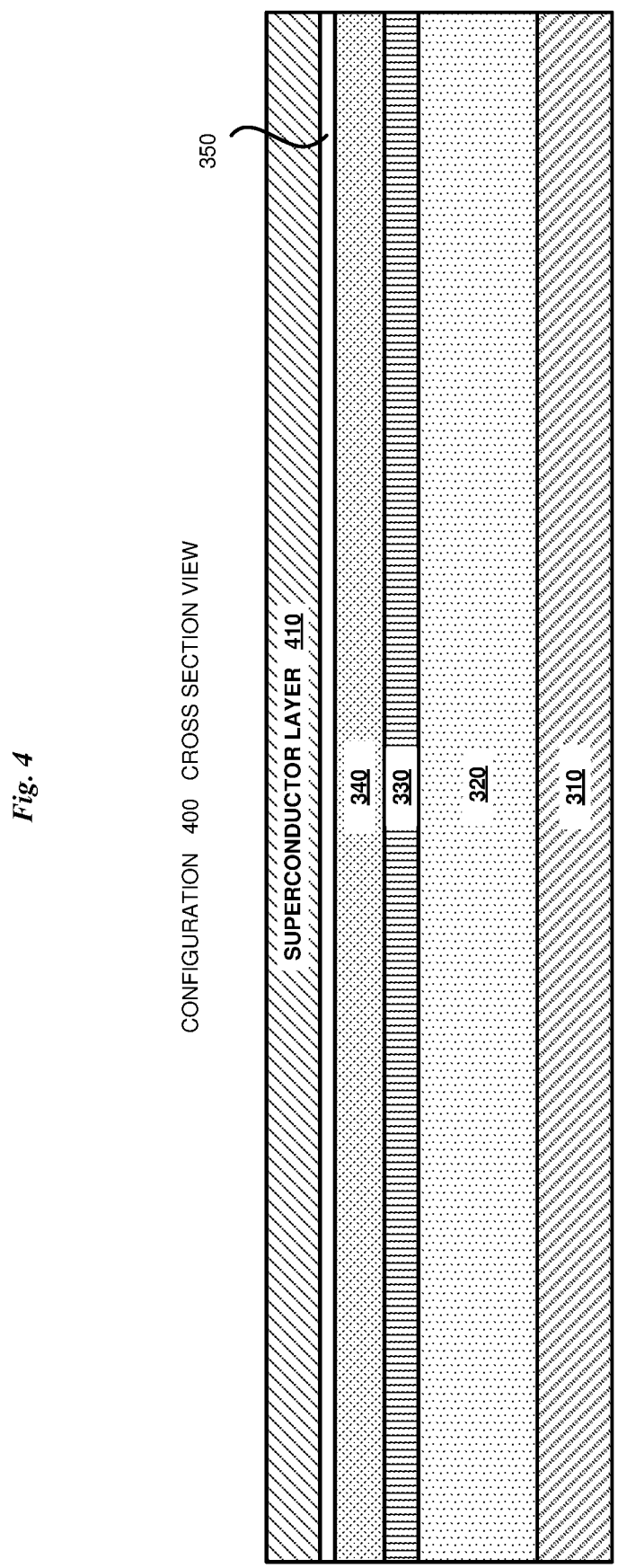
FIG. 4 depicts a block diagram of an example configuration reached in the fabrication of a Majorana fermion quantum computing device in accordance with an illustrative embodiment.

With reference to FIG. 4, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 400 as described herein. Substrate 310, buffer layer 320, protective layer 330, semiconductor layer 340, and protective layer 350 are the same as substrate 310, buffer layer 320, protective layer 330, semiconductor layer 340, and protective layer 350 in FIG. 3.

An embodiment causes the fabrication system to deposit superconductor layer 410 on protective layer 350 (or semiconductor layer 340, if protective layer 350 is not used), using physical vapor deposition (PVD), for example using evaporation or spattering. Superconductor layer 410 is formed of a material that is superconducting within a cryogenic temperature range of 77 K to 0.01K. Aluminum (Al), niobium, lead, tantalum nitride, titanium, titanium nitride, and vanadium are non-limiting examples of suitable materials for superconductor layer 410, although many other materials are suitable for forming superconductor layer 410 and the same are contemplated within the scope of the illustrative embodiments. In embodiments, superconductor layer 410 is between 5 and 50 nm, and preferably between 20 and 30 nm, thick, although a thicker or thinner layer is also possible and contemplated within the scope of the illustrative embodiments.

Figure 5:
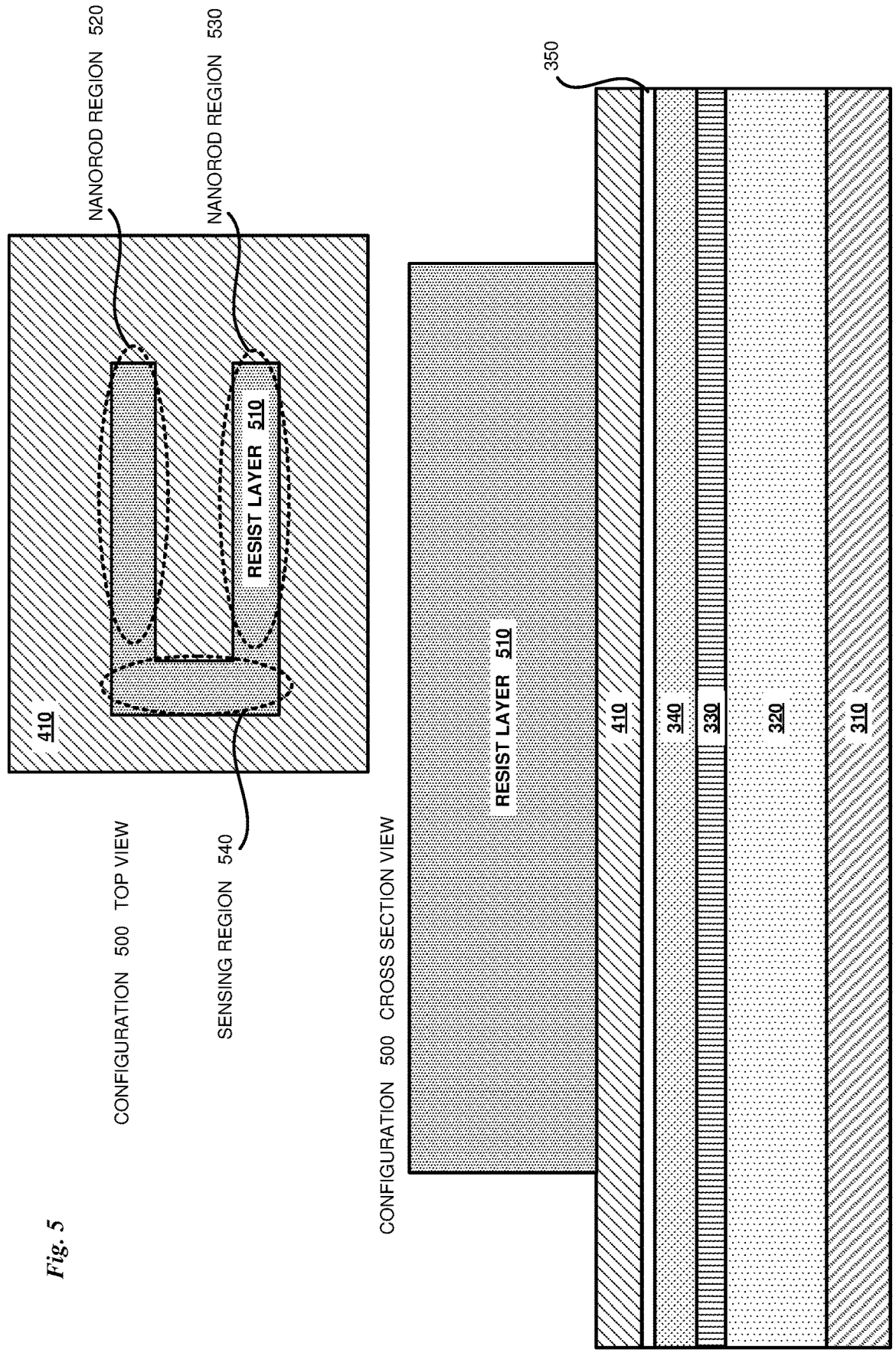
FIG. 5 depicts a block diagram of an example configuration reached in the fabrication of a Majorana fermion quantum computing device in accordance with an illustrative embodiment.

With reference to FIG. 5, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 500 as described herein. Substrate 310, buffer layer 320, protective layer 330, semiconductor layer 340, protective layer 350, and superconductor layer 410 are the same as substrate 310, buffer layer 320, protective layer 330, semiconductor layer 340, protective layer 350, and superconductor layer 410 in FIG. 4.

An embodiment causes the fabrication system to deposit resist layer 510, formed in a resist pattern, on superconductor layer 410. The resist pattern protects nanorod regions 520 and 530 and sensing region 540 from upcoming device processing steps. Resist layer 510 can be formed from any resist material used in lithography.

The depiction of a resist layer formed in a resist pattern and the description of the lithography techniques should not be construed as limiting on the manner of forming the structures described herein. The depicted pattern is merely a simplified and generalized example. Lithography of the depicted structures is possible in many ways. For example, lithography of the described structures is presently accomplished by patterning a resist with photolithography (light) or ebeam lithography (electron beam), developing the resist, then either subtracting deposited material from the openings in the resist, or depositing material in the openings in the resist. The resist is removed at the end. Fabrication processes and technology is constantly changing and other methods of forming the described structures are within the contemplations of the illustrative embodiments so long as the resulting structures have the electrical, mechanical, thermal, and operating characteristics as described herein.

Figure 6:
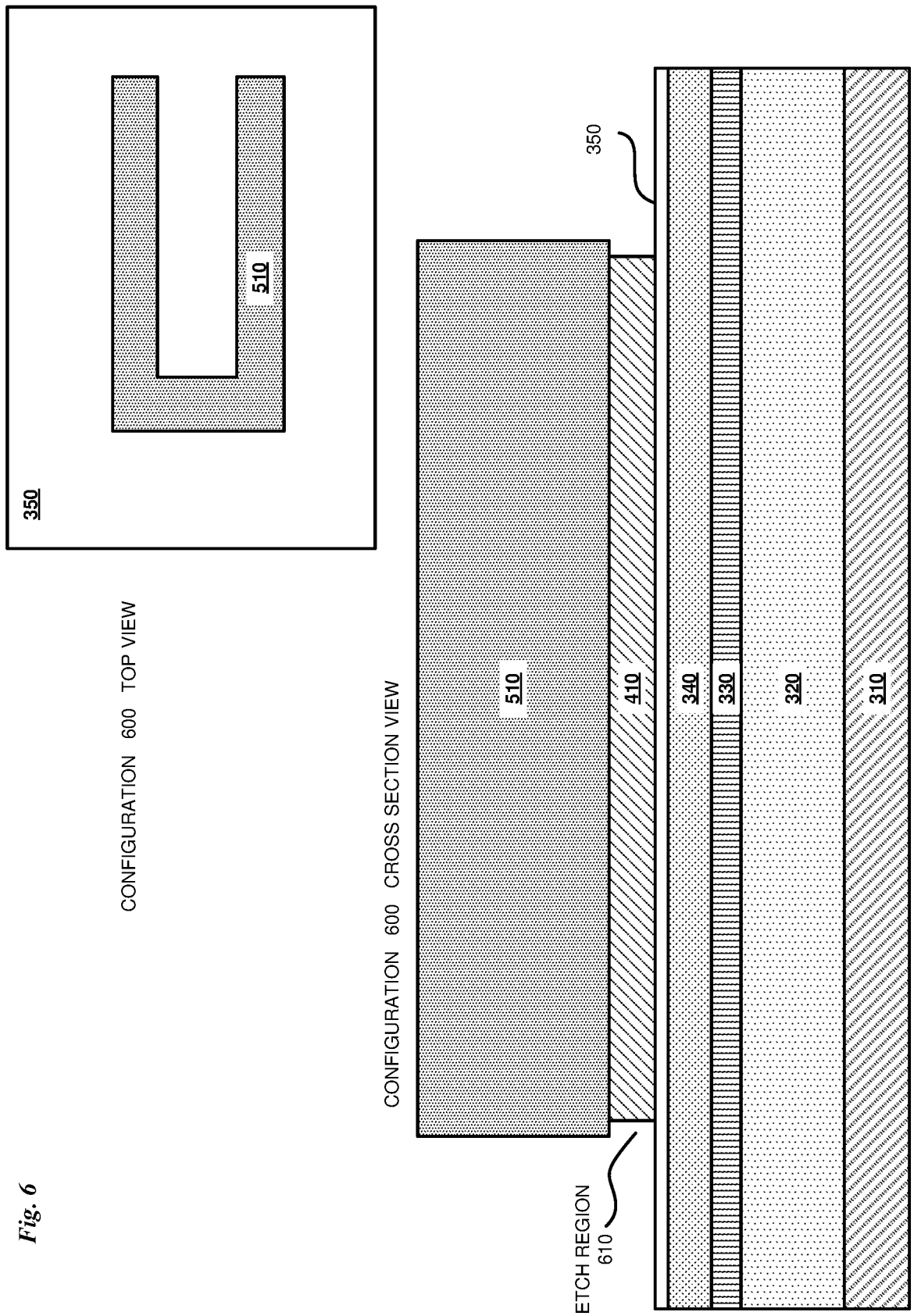
FIG. 6 depicts a block diagram of an example configuration reached in the fabrication of a Majorana fermion quantum computing device in accordance with an illustrative embodiment.

With reference to FIG. 6, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 600 as described herein. Substrate 310, buffer layer 320, protective layer 330, semiconductor layer 340, protective layer 350, superconductor layer 410, and resist layer 510 are the same as substrate 310, buffer layer 320, protective layer 330, semiconductor layer 340, protective layer 350, superconductor layer 410, and resist layer 510 in FIG. 5.

An embodiment causes the fabrication system to perform an etching process, removing portions of superconductor layer 410 and exposing protective layer 350 in regions that are unprotected by resist layer 510. The etching process also produces etch region 610, an undercut region within superconductor layer 410 under resist layer 510. The etching process is selected to minimize surface damage during fabrication. In one embodiment, the etching process is a wet etch process, for example using tetramethylammonium hydroxide (TMAH).

With reference to FIG. 7, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 700 as described herein. Substrate 310, buffer layer 320, protective layer 330, semiconductor layer 340, protective layer 350, superconductor layer 410, and resist layer 510 are the same as substrate 310, buffer layer 320, protective layer 330, semiconductor layer 340, protective layer 350, superconductor layer 410, and resist layer 510 in FIG. 6.

An embodiment causes the fabrication system to perform an ion implant process. The ion implant process disrupts the crystal structure of exposed portions of semiconductor layer 340, forming implant region 710. In implant region 710, semiconductor layer 340 is non-conductive, thus forming an isolation region surrounding the device being fabricated. The ion implant process uses ions of any material suitable for forming an isolation region. Some non-limiting examples of suitable ion implant materials include hydrogen, oxygen, helium, gallium, argon, and neon. Other ion implant materials are also possible and contemplated within the scope of the illustrative embodiments.

Figure 8:
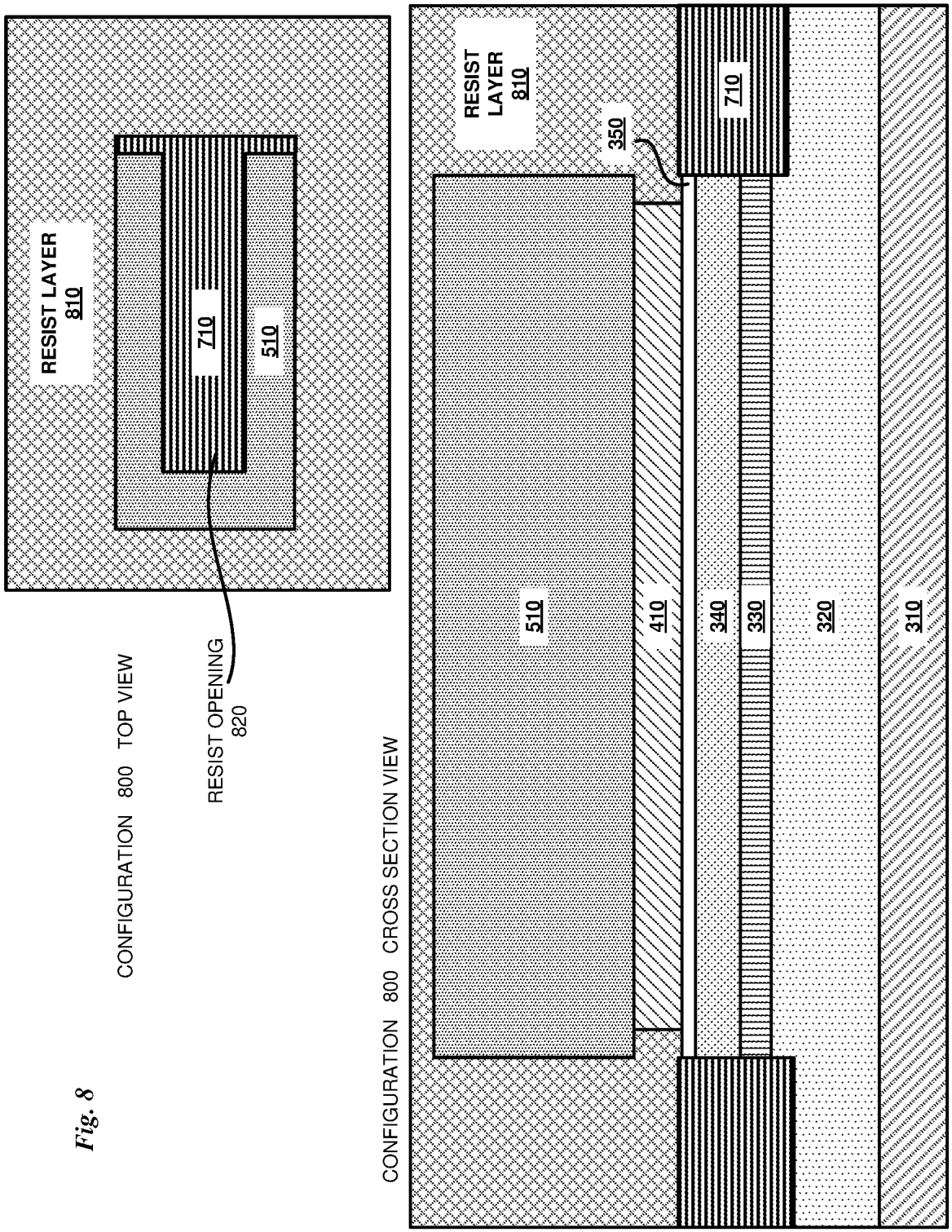
FIG. 8 depicts a block diagram of an example configuration reached in the fabrication of a Majorana fermion quantum computing device in accordance with an illustrative embodiment.

With reference to FIG. 8, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 800 as described herein. Substrate 310, buffer layer 320, protective layer 330, semiconductor layer 340, protective layer 350, superconductor layer 410, resist layer 510, and implant region 710 are the same as substrate 310, buffer layer 320, protective layer 330, semiconductor layer 340, protective layer 350, superconductor layer 410, resist layer 510, and implant region 710 in FIG. 7.

An embodiment causes the fabrication system to deposit resist layer 810, formed in a resist pattern, on resist layer 510 and portions of underlying surfaces exposed through openings in resist layer 510. The resist pattern protects areas other than resist opening 820 from upcoming device processing steps. Resist layer 810 can be formed from any resist material used in lithography, and can be the same or a different material from resist layer 510.

Figure 9:
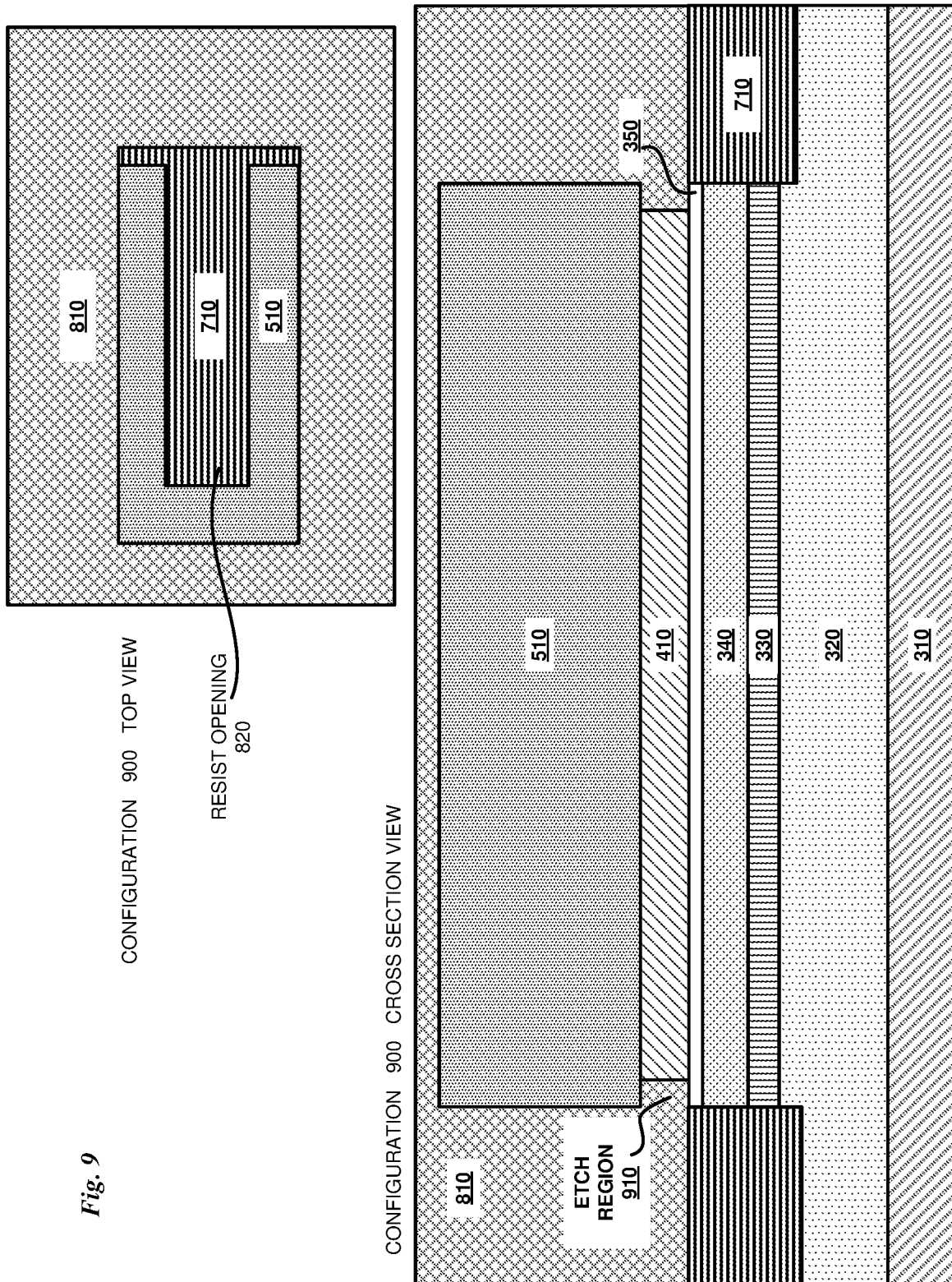
FIG. 9 depicts a block diagram of an example configuration reached in the fabrication of a Majorana fermion quantum computing device in accordance with an illustrative embodiment.

With reference to FIG. 9, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 900 as described herein. Substrate 310, buffer layer 320, protective layer 330, semiconductor layer 340, protective layer 350, superconductor layer 410, resist layer 510, implant region 710, resist layer 810, and resist opening 820 are the same as substrate 310, buffer layer 320, protective layer 330, semiconductor layer 340, protective layer 350, superconductor layer 410, resist layer 510, implant region 710, resist layer 810, and resist opening 820 in FIG. 8.

An embodiment causes the fabrication system to perform an etching process, removing superconductor layer 410 to expose protective layer 350 in regions that are unprotected by resist layer 810. The etching process also produces etch region 910, an undercut region within superconductor layer 410 under resist layers 510 and 810. The etching process is selected to minimize surface damage during fabrication, and can be the same or a different process as that used to form configuration 600. In one embodiment, the etching process is a wet etch process, for example using tetramethylammonium hydroxide (TMAH).

Figure 10:
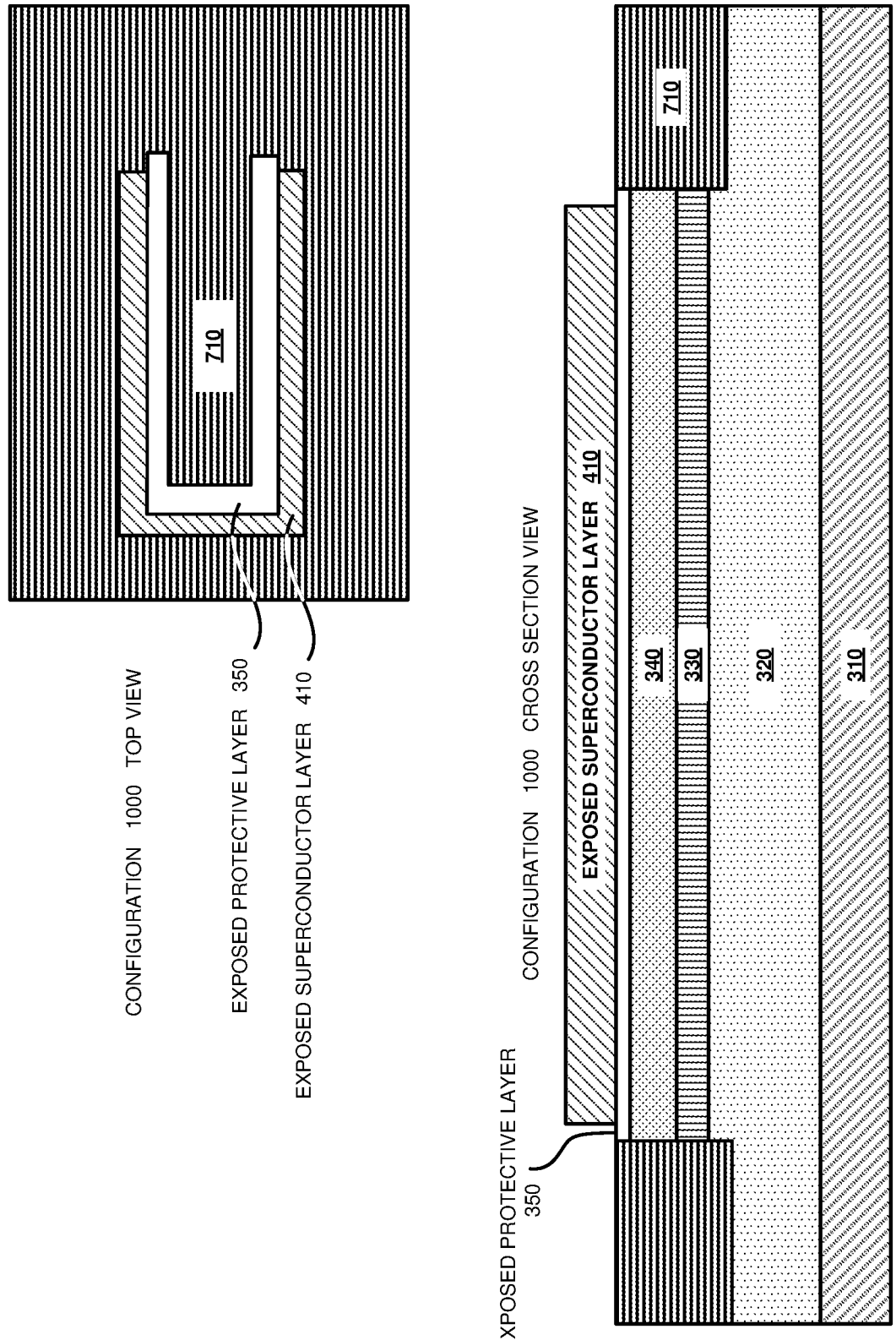
FIG. 10 depicts a block diagram of an example configuration reached in the fabrication of a Majorana fermion quantum computing device in accordance with an illustrative embodiment.

With reference to FIG. 10, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 1000 as described herein. Substrate 310, buffer layer 320, protective layer 330, semiconductor layer 340, protective layer 350, superconductor layer 410, and implant region 710 are the same as substrate 310, buffer layer 320, protective layer 330, semiconductor layer 340, protective layer 350, superconductor layer 410, and implant region 710 in FIG. 9.

An embodiment causes the fabrication system to perform a resist removal process, removing resist layers 510 and 810, exposing portions of superconductor layer 410 and protective layer 350. An embodiment uses any resist removal process used in lithography. As a result, in configuration 1100, portions of protective layer 350 are exposed in areas at one side of superconductor layer 410.

Figure 11:
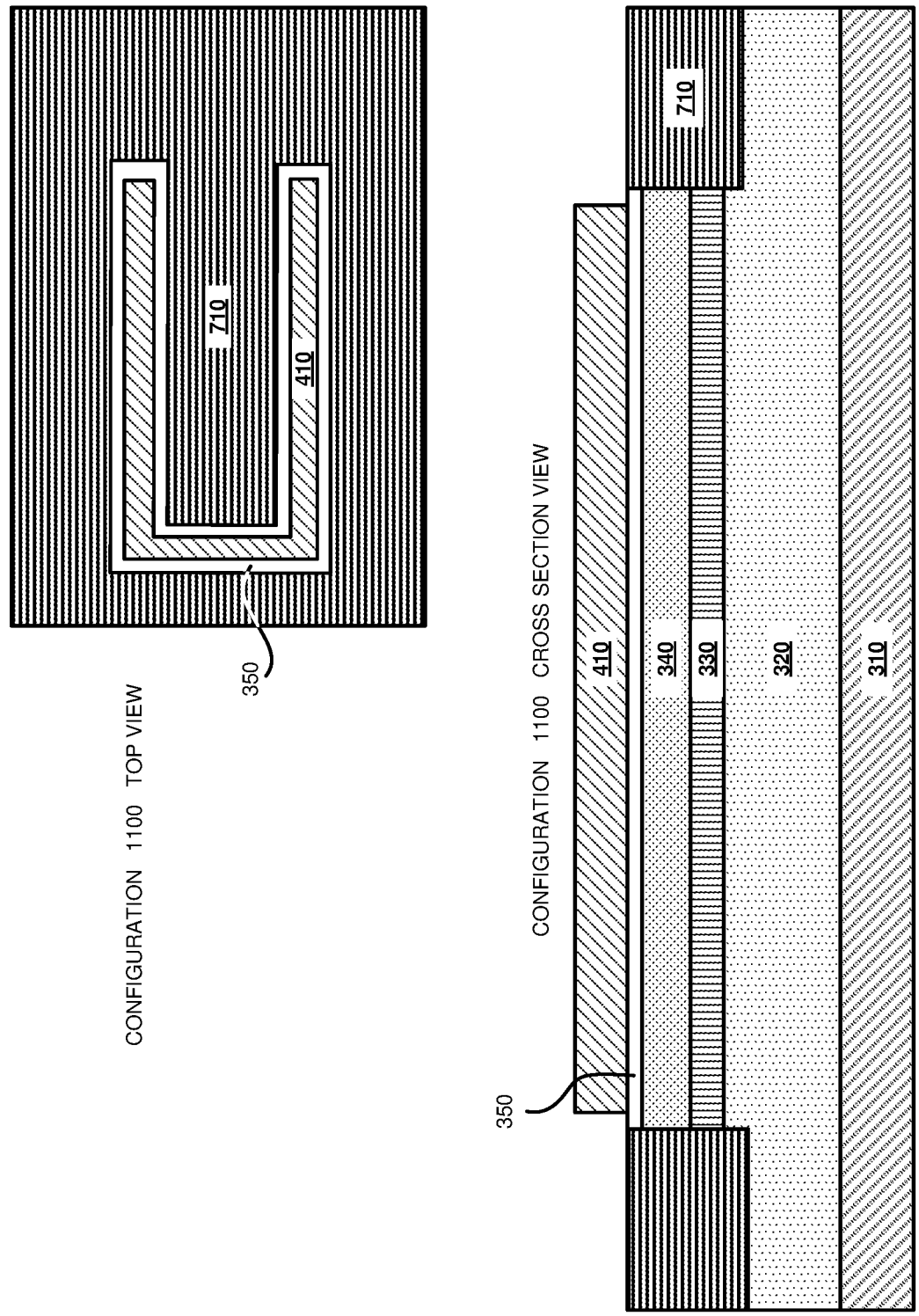
FIG. 11 depicts a block diagram of an example configuration reached in the fabrication of a Majorana fermion quantum computing device in accordance with an illustrative embodiment.

With reference to FIG. 11, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 1100 as described herein. Substrate 310, buffer layer 320, protective layer 330, semiconductor layer 340, protective layer 350, superconductor layer 410, and implant region 710 are the same as substrate 310, buffer layer 320, protective layer 330, semiconductor layer 340, protective layer 350, superconductor layer 410, and implant region 710 in FIG. 10.

Configuration 1100 is a configuration that is optionally reachable from configuration 700 in FIG. 7 using a suitably configured mask in resist layer 510 in a lithographic process, omitting the fabrication steps described with reference to configurations 800 and 900. In configuration 1100, portions of protective layer 350 are exposed in areas surrounding superconductor layer 410. Configurations 1000 and 1100 perform similarly; however, configuration 1100 is preferred for its use of fewer process steps than configuration 1000.

Figure 12:
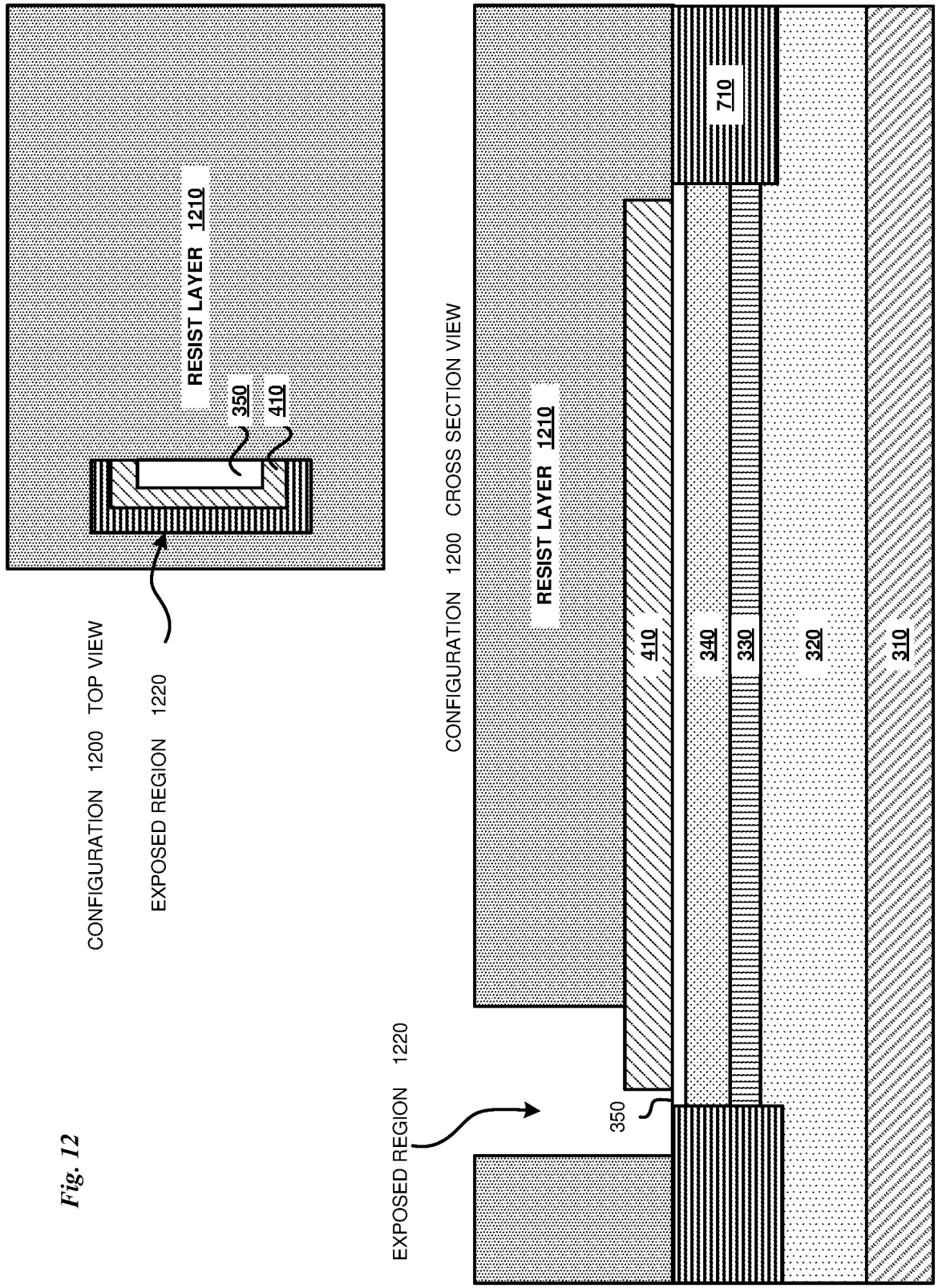
FIG. 12 depicts a block diagram of an example configuration reached in the fabrication of a Majorana fermion quantum computing device in accordance with an illustrative embodiment.

With reference to FIG. 12, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 1200 as described herein. Substrate 310, buffer layer 320, protective layer 330, semiconductor layer 340, protective layer 350, superconductor layer 410, and implant region 710 are the same as substrate 310, buffer layer 320, protective layer 330, semiconductor layer 340, protective layer 350, superconductor layer 410, and implant region 710 in FIG. 11. Configuration 1200 is depicted as the result of manipulating configuration 1000, but can also be the result of manipulating configuration 1100 instead.

An embodiment causes the fabrication system to deposit resist layer 1210, which includes an opening that exposes region 1220, including portions of protective layer 350 and superconductor layer 410. Region 1220 is intended to become the sensing region of device 200. Resist layer 1210 can be formed from any resist material used in lithography, and can be the same or a different material from resist layers 510 and 810.

Figure 13:
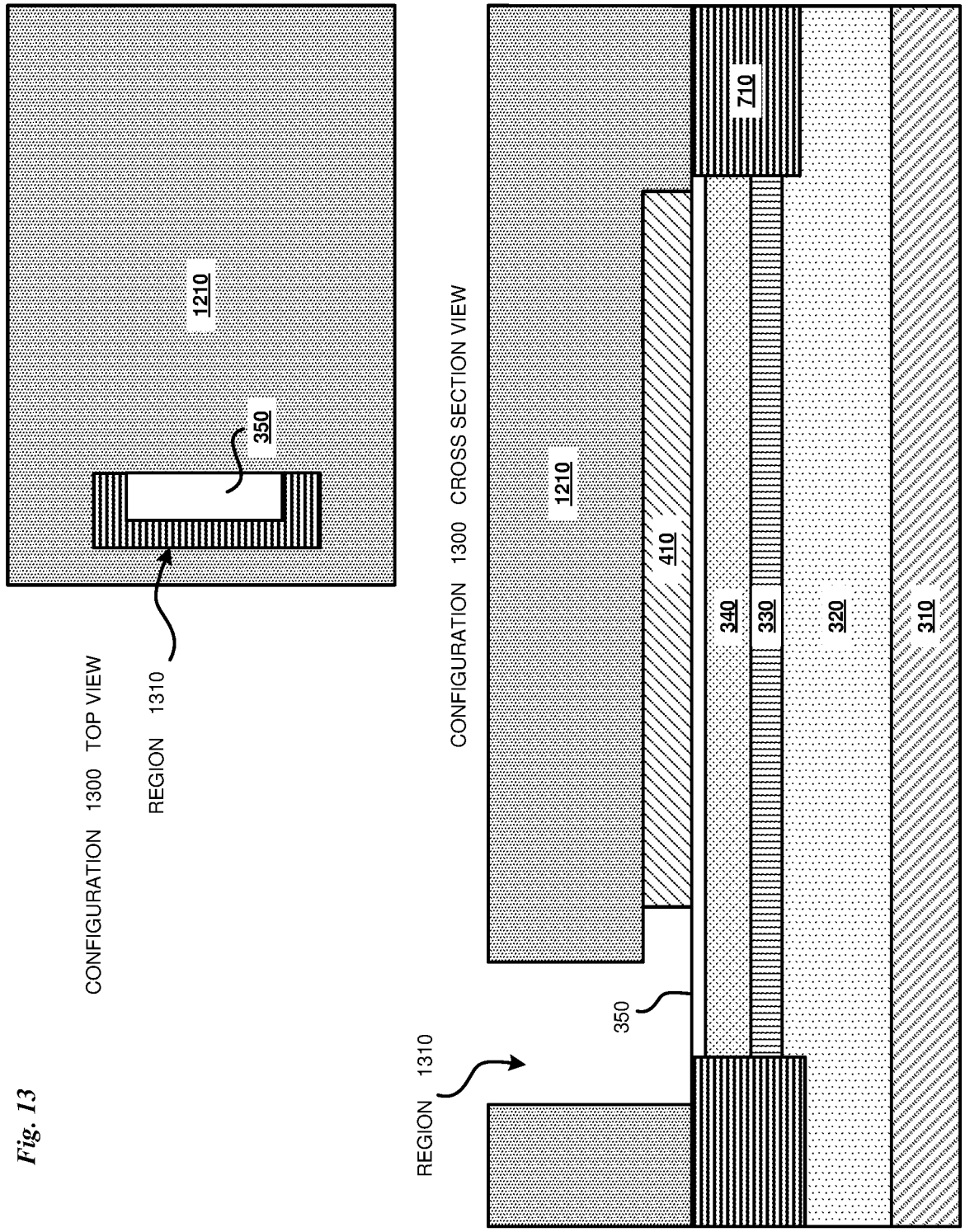
FIG. 13 depicts a block diagram of an example configuration reached in the fabrication of a Majorana fermion quantum computing device in accordance with an illustrative embodiment.

With reference to FIG. 13, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 1300 as described herein. Substrate 310, buffer layer 320, protective layer 330, semiconductor layer 340, protective layer 350, superconductor layer 410, implant region 710, and resist layer 1210 are the same as substrate 310, buffer layer 320, protective layer 330, semiconductor layer 340, protective layer 350, superconductor layer 410, implant region 710, and resist layer 1210 in FIG. 12.

An embodiment causes the fabrication system to perform an etching process, removing superconductor layer 410 to expose protective layer 350 in region 1310, including an undercut region within superconductor layer 410 under resist layer 1210. The etching process is selected to minimize surface damage during fabrication, and can be the same or a different process as that used to form configuration 600. In one embodiment, the etching process is a wet etch process, for example using tetramethylammonium hydroxide (TMAH).

Figure 14:
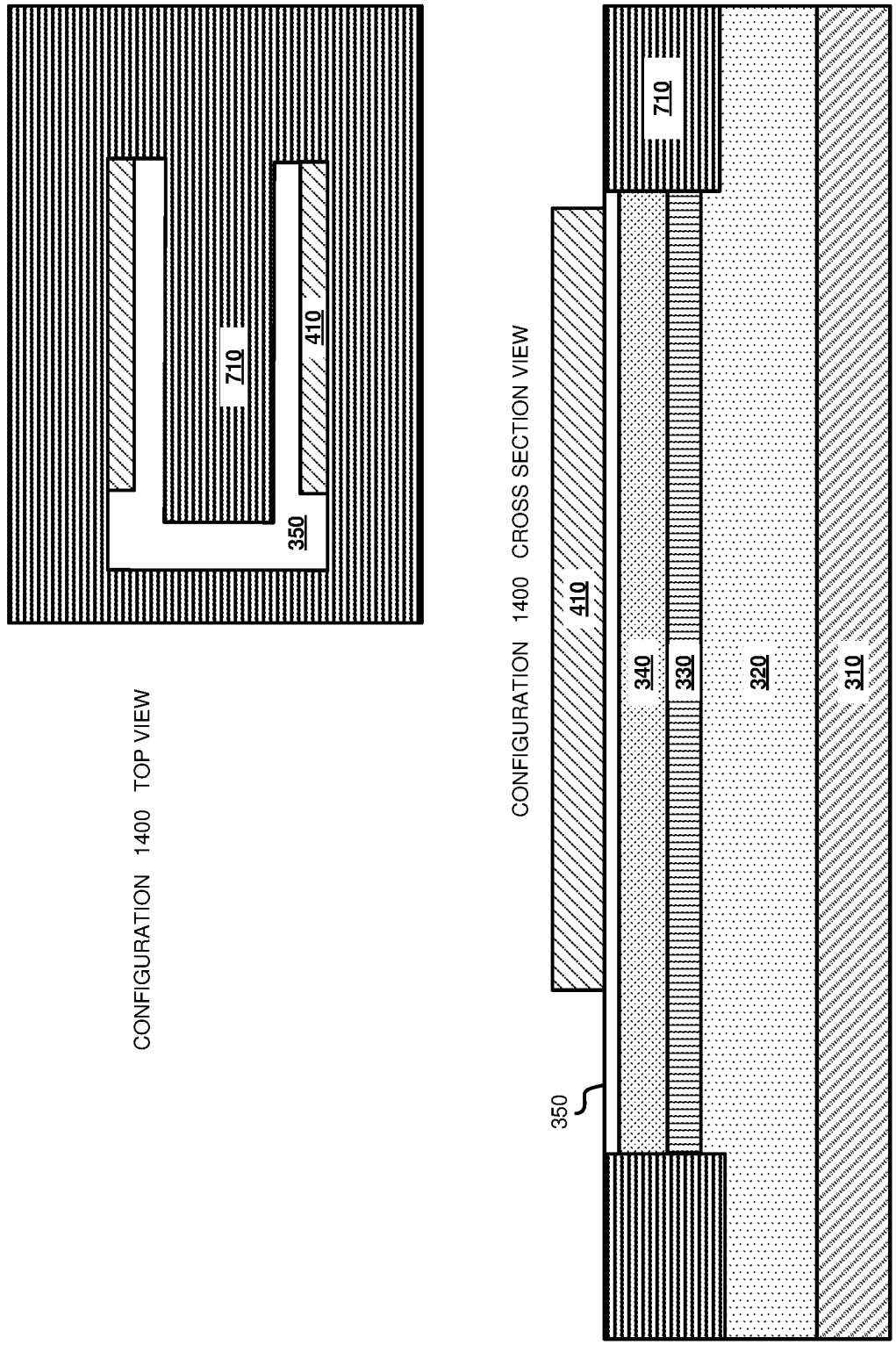
FIG. 14 depicts a block diagram of an example configuration reached in the fabrication of a Majorana fermion quantum computing device in accordance with an illustrative embodiment.

With reference to FIG. 14, this figure depicts a block diagram of an example configuration reached in the fabrication of a Majorana fermion quantum computing device in accordance with an illustrative embodiment. Application 105 in FIG. 1 interacts with fabrication system 107 to produce or manipulate configuration 1400 as described herein. Substrate 310, buffer layer 320, protective layer 330, semiconductor layer 340, protective layer 350, superconductor layer 410, and implant region 710 are the same as substrate 310, buffer layer 320, protective layer 330, semiconductor layer 340, protective layer 350, superconductor layer 410, and implant region 710 in FIG. 13.

An embodiment causes the fabrication system to perform a resist removal process, removing resist layer 1210, exposing portions of superconductor layer 410 and protective layer 350. An embodiment uses any resist removal process used in lithography. Optionally, the resist, etching, and resist removal steps described with reference to configurations 1200 and 1300 can be combined with using a suitably configured mask in resist layer 510 or 810 in a lithographic process.

Figure 15:
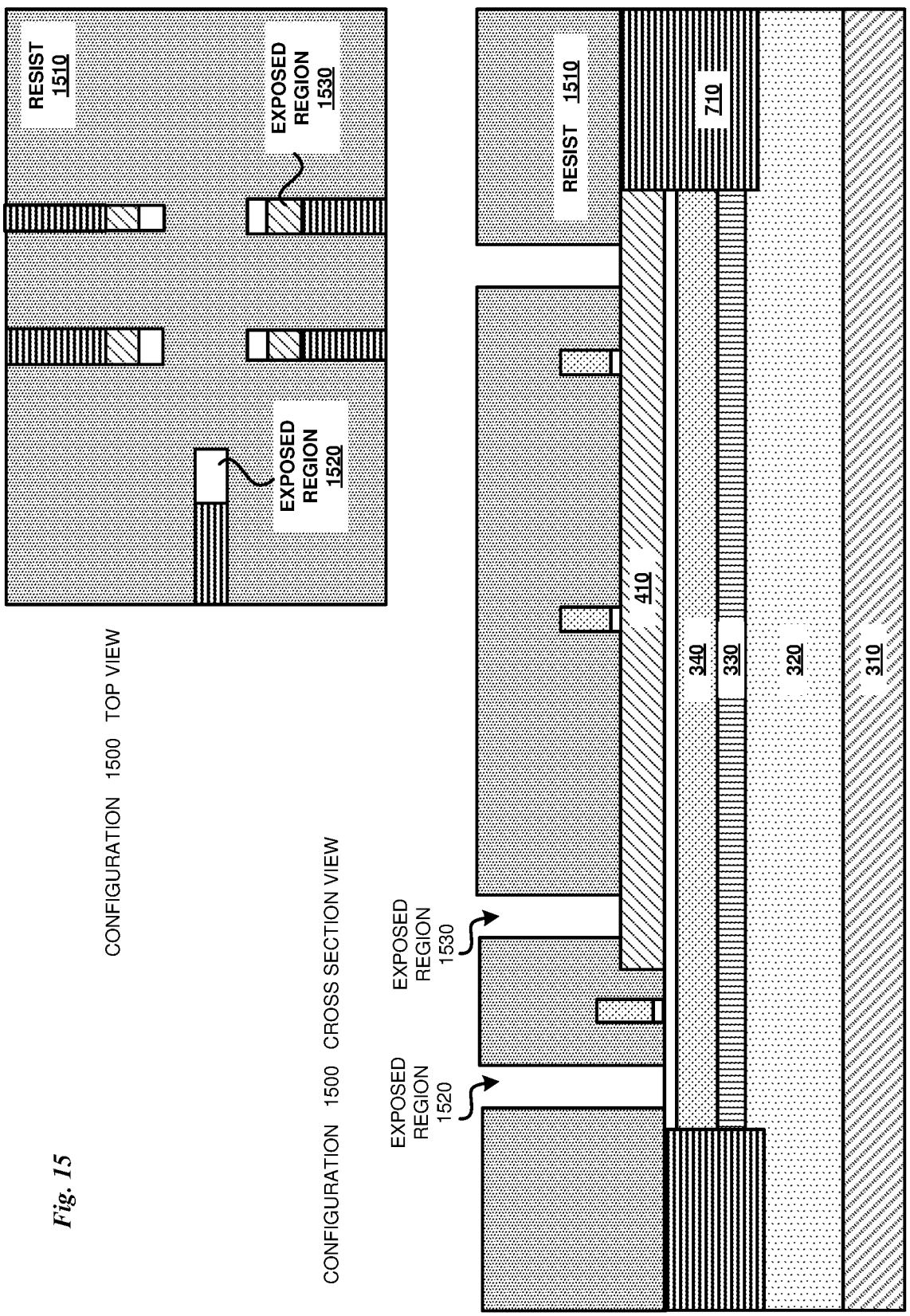
FIG. 15 depicts a block diagram of an example configuration reached in the fabrication of a Majorana fermion quantum computing device in accordance with an illustrative embodiment.

With reference to FIG. 15, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 1500 as described herein. Substrate 310, buffer layer 320, protective layer 330, semiconductor layer 340, protective layer 350, superconductor layer 410, and implant region 710 are the same as substrate 310, buffer layer 320, protective layer 330, semiconductor layer 340, protective layer 350, superconductor layer 410, and implant region 710 in FIG. 14.

An embodiment causes the fabrication system to deposit resist 1510 on configuration 1400, with openings at exposed regions 1520 and 1530. Resist 1510 can be formed from any resist material used in lithography, and can be the same or a different material from other resist layers described herein.

Figure 16:
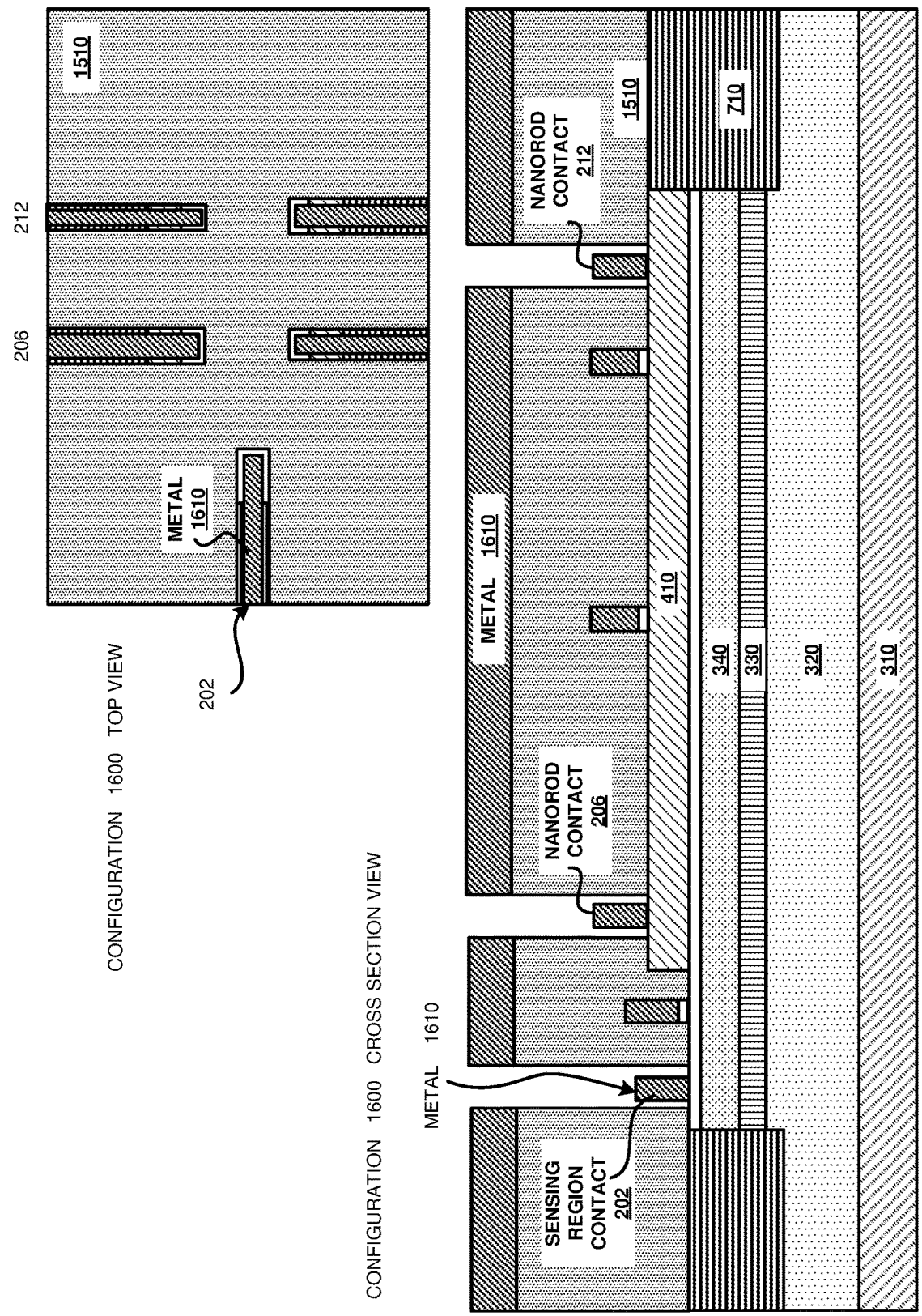
FIG. 16 depicts a block diagram of an example configuration reached in the fabrication of a Majorana fermion quantum computing device in accordance with an illustrative embodiment.

With reference to FIG. 16, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 1600 as described herein. Substrate 310, buffer layer 320, protective layer 330, semiconductor layer 340, protective layer 350, superconductor layer 410, implant region 710, resist 1510, and exposed regions 1520 and 1530 are the same as substrate 310, buffer layer 320, protective layer 330, semiconductor layer 340, protective layer 350, superconductor layer 410, implant region 710, resist 1510, and exposed regions 1520 and 1530 in FIG. 15.

An embodiment causes the fabrication system to form metal 1610 on portions of configuration 1500 exposed by openings in the resist layer. Metal 1610 is deposited using any lithographic process for metal deposition. Metal 1610 comprises a material with high electrical and thermal conductivity (above a threshold RRR and above a threshold thermal conductivity) in the cryogenic temperature range, for operations in the temperature range of 77 K to 0.01K. Although a metal that is superconducting in the cryogenic temperature range is preferred because such a metal has little resistance to generate heat, a non-superconducting metal can also be used. Some non-limiting examples of materials for metal 1610 are gold, palladium, vanadium, aluminum, lead, tin, platinum, niobium, tantalum, tantalum nitride, titanium, and titanium nitride. These examples of layer materials are not intended to be limiting. From this disclosure, those of ordinary skill in the art will be able to conceive of many other materials suitable for forming metal 1610 and the same are contemplated within the scope of the illustrative embodiments.

Metal 1610 on protective layer 350 forms sensing region contact 202. Metal 1610 on superconductor layer 410 forms nanorod contacts 206 and 212.

Figure 17:
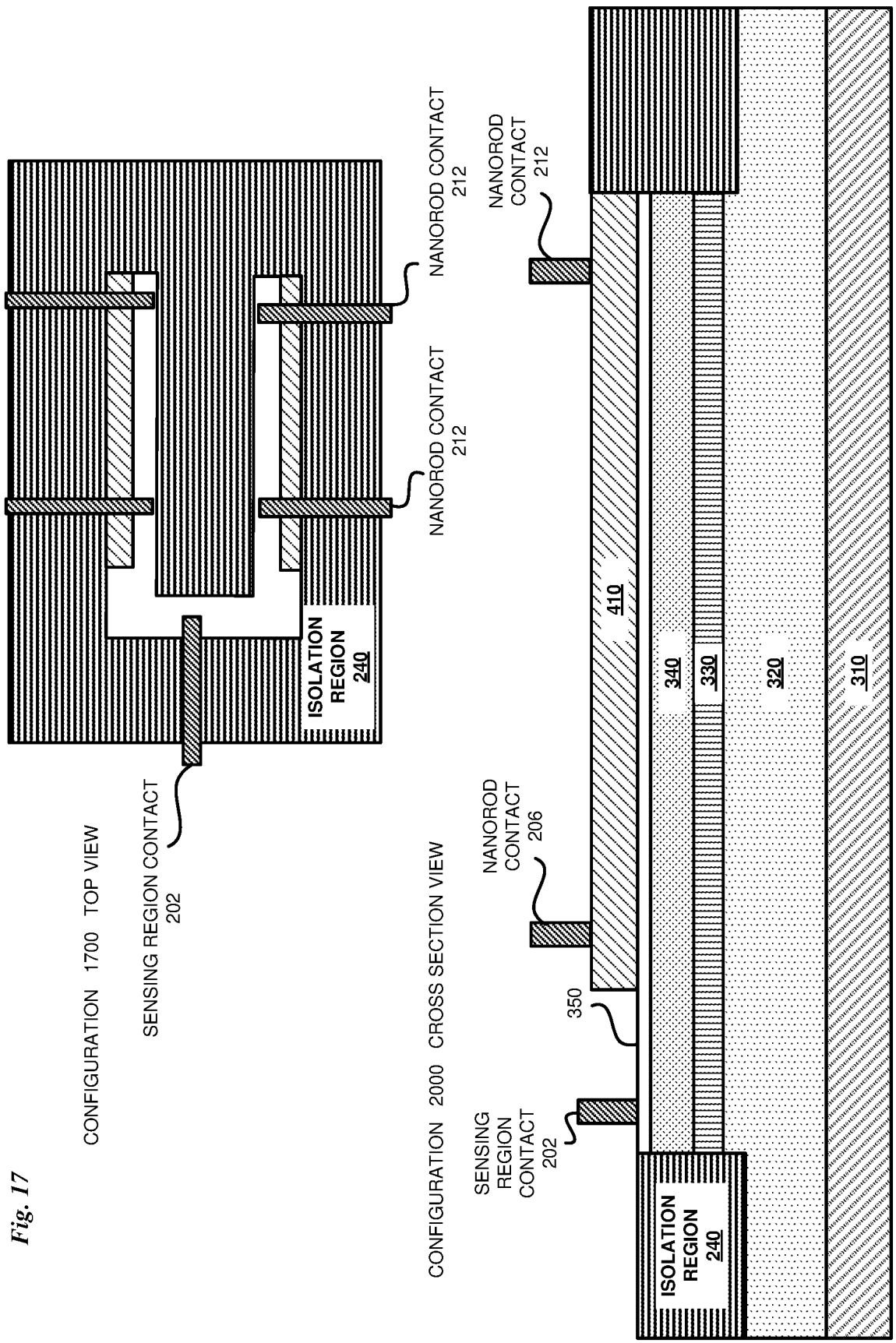
FIG. 17 depicts a block diagram of an example configuration reached in the fabrication of a Majorana fermion quantum computing device in accordance with an illustrative embodiment.

With reference to FIG. 17, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 1700 as described herein. Substrate 310, buffer layer 320, protective layer 330, semiconductor layer 340, protective layer 350, superconductor layer 410, implant region 710, metal 1610, sensing region contact 202 and nanorod contacts 206 and 212 are the same as substrate 310, buffer layer 320, protective layer 330, semiconductor layer 340, protective layer 350, superconductor layer 410, implant region 710, metal 1610, sensing region contact 202 and nanorod contacts 206 and 212 in FIG. 16.

An embodiment causes the fabrication system to perform a resist removal process, removing resist 1510 from configuration 1600 and exposing underlying portions of configuration 1700. An embodiment uses any resist removal process used in lithography.

Figure 18:
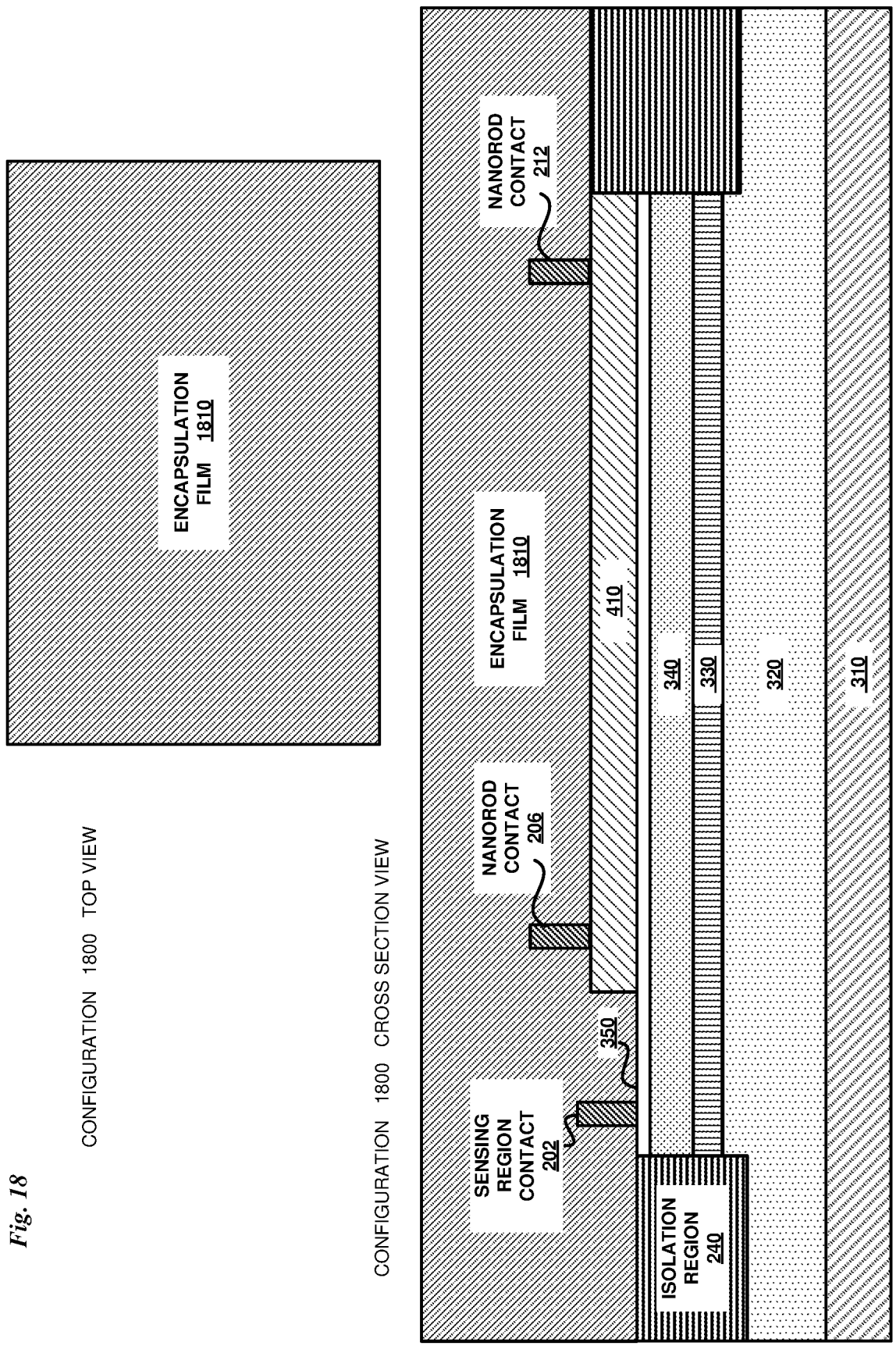
FIG. 18 depicts a block diagram of an example configuration reached in the fabrication of a Majorana fermion quantum computing device in accordance with an illustrative embodiment.

With reference to FIG. 18, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 1800 as described herein. Substrate 310, buffer layer 320, protective layer 330, semiconductor layer 340, protective layer 350, superconductor layer 410, implant region 710, metal 1610, sensing region contact 202, and nanorod contacts 206 and 212 are the same as substrate 310, buffer layer 320, protective layer 330, semiconductor layer 340, protective layer 350, superconductor layer 410, implant region 710, metal 1610, sensing region contact 202, and nanorod contacts 206 and 212 in FIG. 17.

An embodiment causes the fabrication system to deposit encapsulation film 1810 on configuration 1700. Encapsulation film 1810 protects structures on a surface of configuration 1800 while further processing is performed on the opposite surface. Encapsulation film 1810 can be formed from any encapsulation film material used in lithography, for example germanium, silicon germanium (SiGe) oxide, tungsten oxide, or gallium oxide. These examples of materials are not intended to be limiting. From this disclosure, those of ordinary skill in the art will be able to conceive of many other materials suitable for forming encapsulation film 1810 and the same are contemplated within the scope of the illustrative embodiments.

Figure 19:
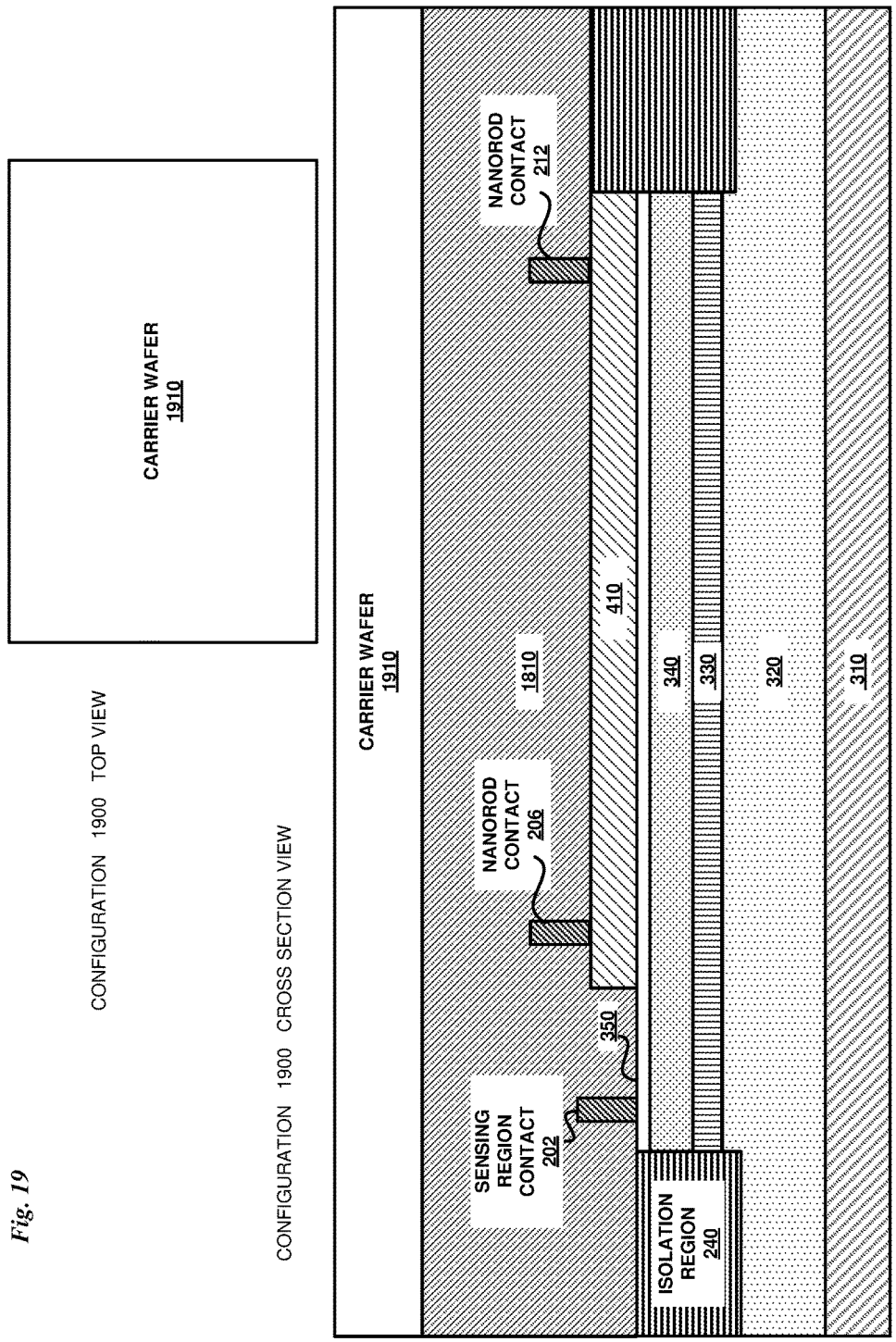
FIG. 19 depicts a block diagram of an example configuration reached in the fabrication of a Majorana fermion quantum computing device in accordance with an illustrative embodiment.

With reference to FIG. 19, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 1900 as described herein. Substrate 310, buffer layer 320, protective layer 330, semiconductor layer 340, protective layer 350, superconductor layer 410, implant region 710, metal 1610, sensing region contact 202, nanorod contacts 206 and 212, and encapsulation film 1810 are the same as substrate 310, buffer layer 320, protective layer 330, semiconductor layer 340, protective layer 350, superconductor layer 410, implant region 710, metal 1610, sensing region contact 202, nanorod contacts 206 and 212, and encapsulation film 1810 in FIG. 18.

An embodiment causes the fabrication system to form carrier wafer 1910 on encapsulation film 1810. Carrier wafer 1910 provides structural support for the device while further processing is performed. Carrier wafer 1910 can be any suitable carrier wafer or substrate material as described herein. These examples of carrier wafer and substrate materials are not intended to be limiting. From this disclosure, those of ordinary skill in the art will be able to conceive of many other materials suitable for forming carrier wafer 1910 and the same are contemplated within the scope of the illustrative embodiments.

Figure 20:
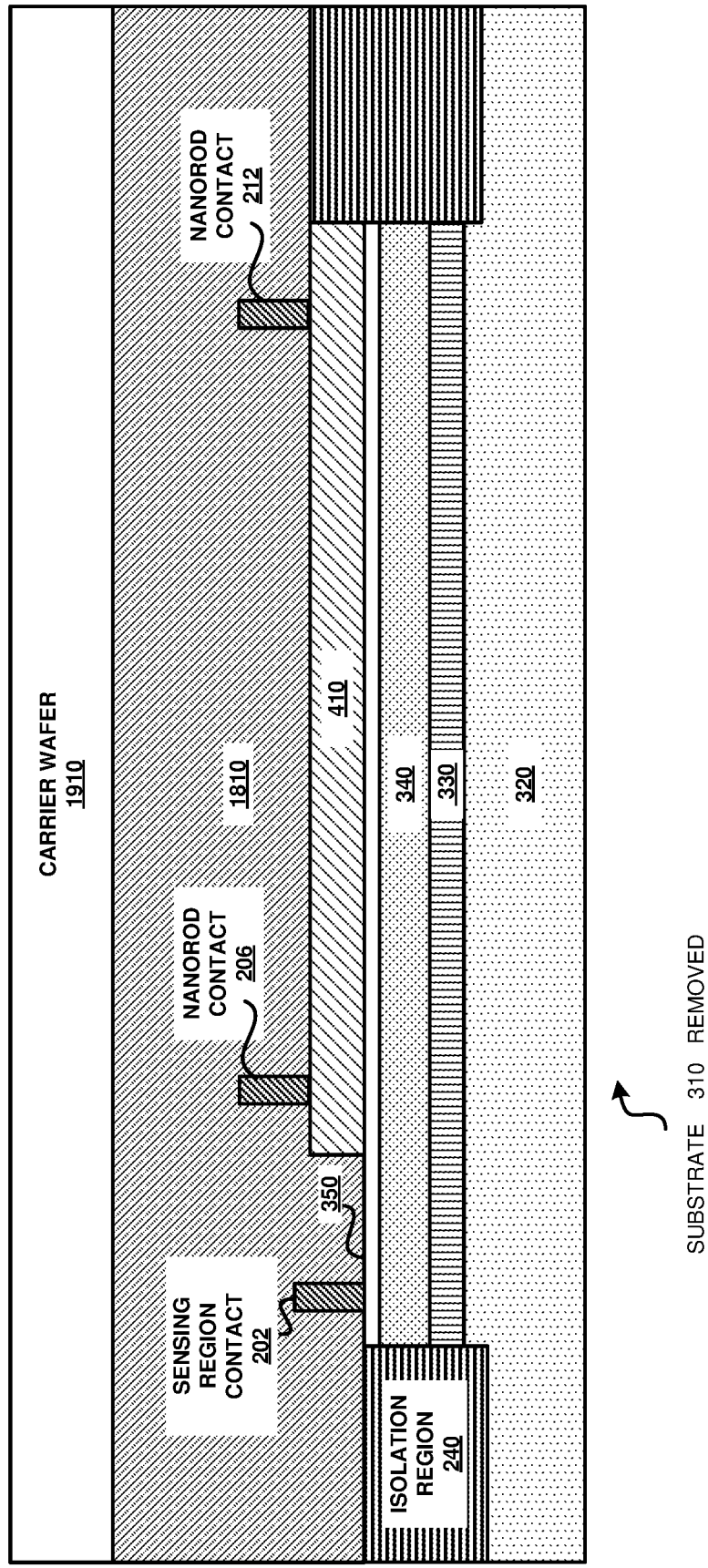
FIG. 20 depicts a block diagram of an example configuration reached in the fabrication of a Majorana fermion quantum computing device in accordance with an illustrative embodiment.

With reference to FIG. 20, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 2000 as described herein. Substrate 310, buffer layer 320, protective layer 330, semiconductor layer 340, protective layer 350, superconductor layer 410, implant region 710, metal 1610, sensing region contact 202, nanorod contacts 206 and 212, encapsulation film 1810, and carrier wafer 1910 are the same as substrate 310, buffer layer 320, protective layer 330, semiconductor layer 340, protective layer 350, superconductor layer 410, implant region 710, metal 1610, sensing region contact 202, nanorod contacts 206 and 212, encapsulation film 1810, and carrier wafer 1910 in FIG. 19.

An embodiment causes the fabrication system to remove substrate 310, exposing buffer layer 320 for further processing.

Figure 21:
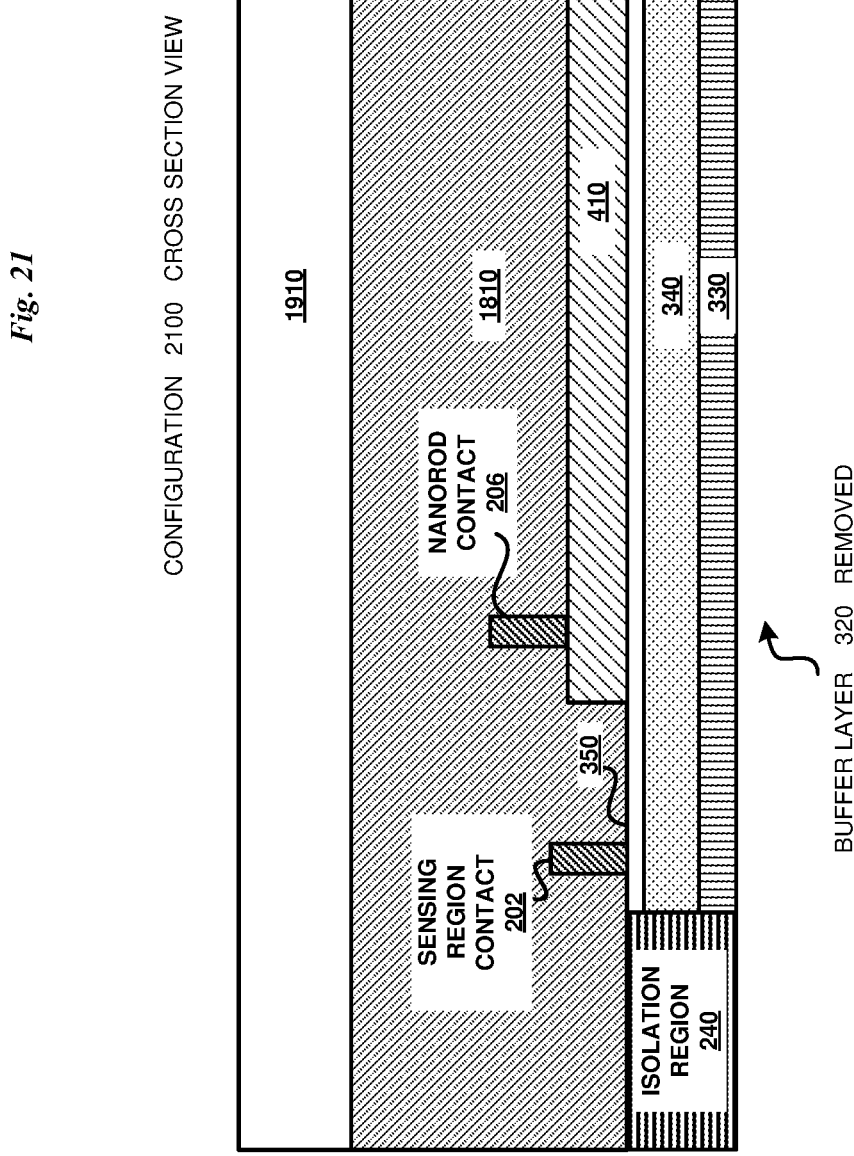
FIG. 21 depicts a block diagram of an example configuration reached in the fabrication of a Majorana fermion quantum computing device in accordance with an illustrative embodiment.

With reference to FIG. 21, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 2100 as described herein. Buffer layer 320, protective layer 330, semiconductor layer 340, protective layer 350, superconductor layer 410, implant region 710, metal 1610, sensing region contact 202, nanorod contacts 206 and 212, encapsulation film 1810, and carrier wafer 1910 are the same as buffer layer 320, protective layer 330, semiconductor layer 340, protective layer 350, superconductor layer 410, implant region 710, metal 1610, sensing region contact 202, nanorod contacts 206 and 212, encapsulation film 1810, and carrier wafer 1910 in FIG. 20.

An embodiment causes the fabrication system to remove buffer layer 320, exposing protective layer 330 for further processing.

Figure 22:
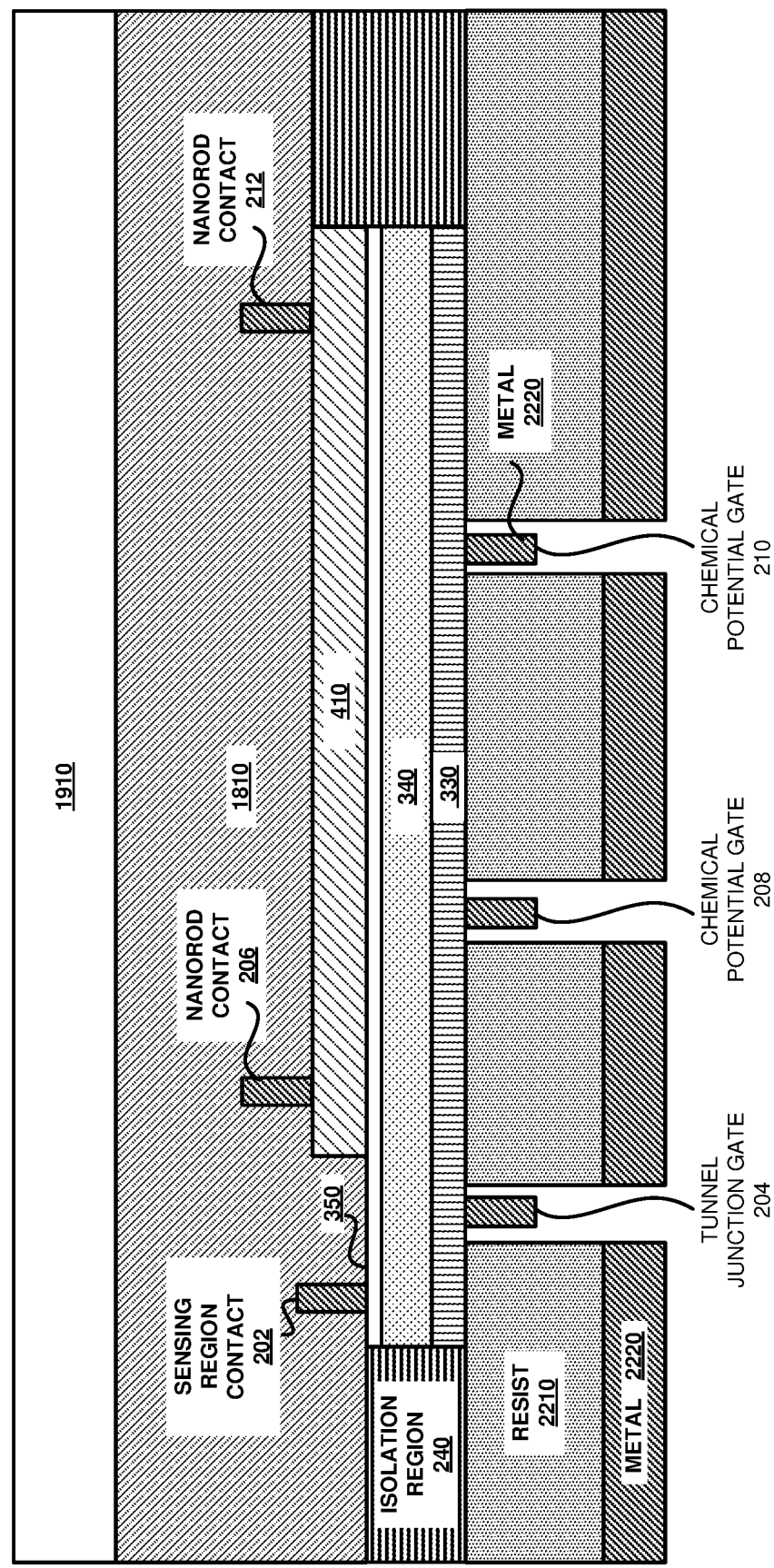
FIG. 22 depicts a block diagram of an example configuration reached in the fabrication of a Majorana fermion quantum computing device in accordance with an illustrative embodiment.

With reference to FIG. 22, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 2200 as described herein. Protective layer 330, semiconductor layer 340, protective layer 350, superconductor layer 410, implant region 710, metal 1610, sensing region contact 202, nanorod contacts 206 and 212, encapsulation film 1810, and carrier wafer 1910 are the same as protective layer 330, semiconductor layer 340, protective layer 350, superconductor layer 410, implant region 710, metal 1610, sensing region contact 202, nanorod contacts 206 and 212, encapsulation film 1810, and carrier wafer 1910 in FIG. 21. Tunnel junction gate 204 and chemical potential gates 208 and 210 are the same as tunnel junction gate 204 and chemical potential gates 208 and 210 in FIG. 2.

An embodiment causes the fabrication system to form resist 2210 on now-exposed protective layer 330, followed by forming metal 2220 on resist 2210 and exposed regions of protective layer 330. Resist 2210 can be formed from any resist material used in lithography, and can be the same as or a different material from other resist layers described herein. Metal 2220 is deposited using any suitable metal deposition process, can be formed from any metal material described herein, and can be the same or a different material from other metal layers described herein. Metal 2220 in the sensing region forms tunnel junction gate 204. Metal 2220 outside the sensing region, in proximity to superconductor layer 410, forms chemical potential gates 208 and 210.

Figure 23:
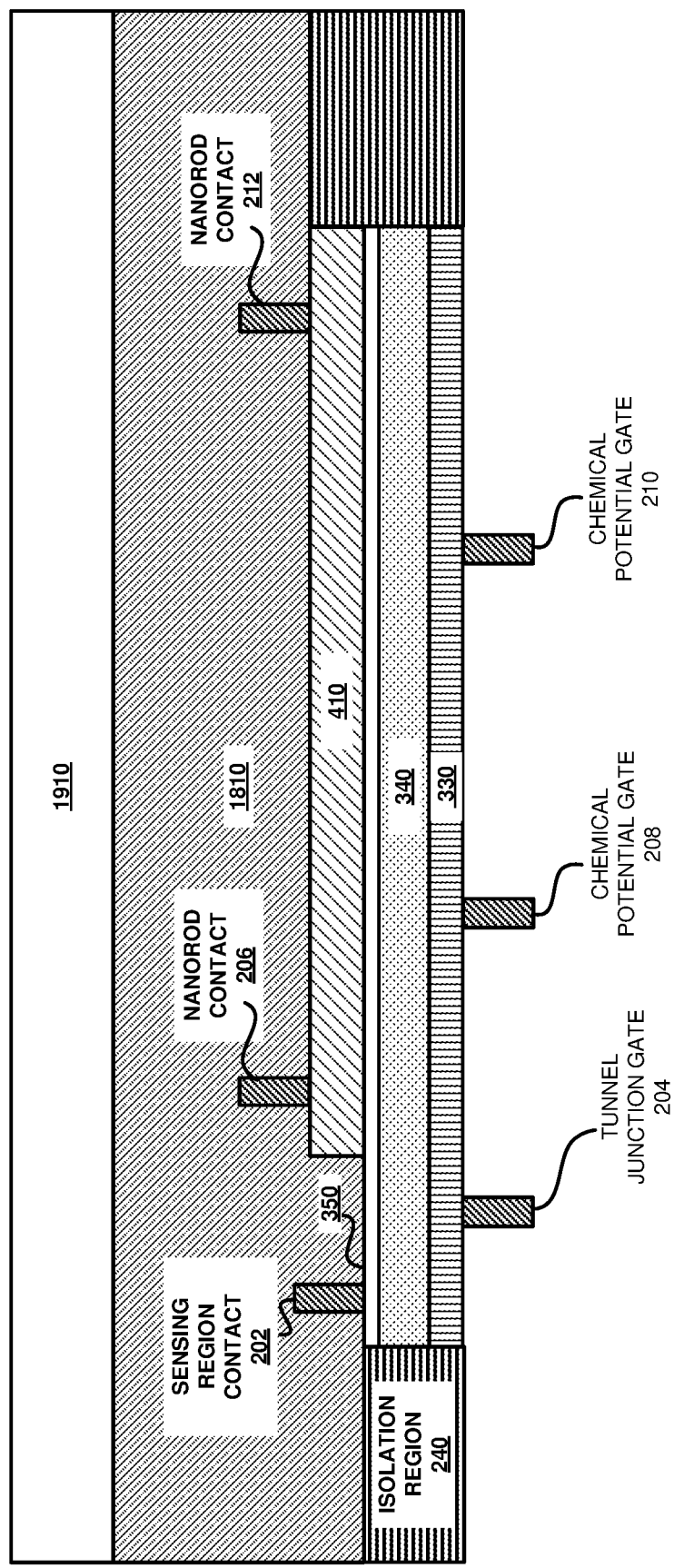
FIG. 23 depicts a block diagram of an example configuration reached in the fabrication of a Majorana fermion quantum computing device in accordance with an illustrative embodiment.

With reference to FIG. 23, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 2300 as described herein. Protective layer 330, semiconductor layer 340, protective layer 350, superconductor layer 410, implant region 710, metal 1610, sensing region contact 202, nanorod contacts 206 and 212, encapsulation film 1810, carrier wafer 1910, metal 2220, tunnel junction gate 204, and chemical potential gates 208 and 210 are the same as protective layer 330, semiconductor layer 340, protective layer 350, superconductor layer 410, implant region 710, metal 1610, sensing region contact 202, nanorod contacts 206 and 212, encapsulation film 1810, carrier wafer 1910, metal 2220, tunnel junction gate 204, and chemical potential gates 208 and 210 in FIG. 22.

An embodiment causes the fabrication system to perform a resist removal process, removing resist 2210 from configuration 2200. An embodiment uses any resist removal process used in lithography.

Figure 24:
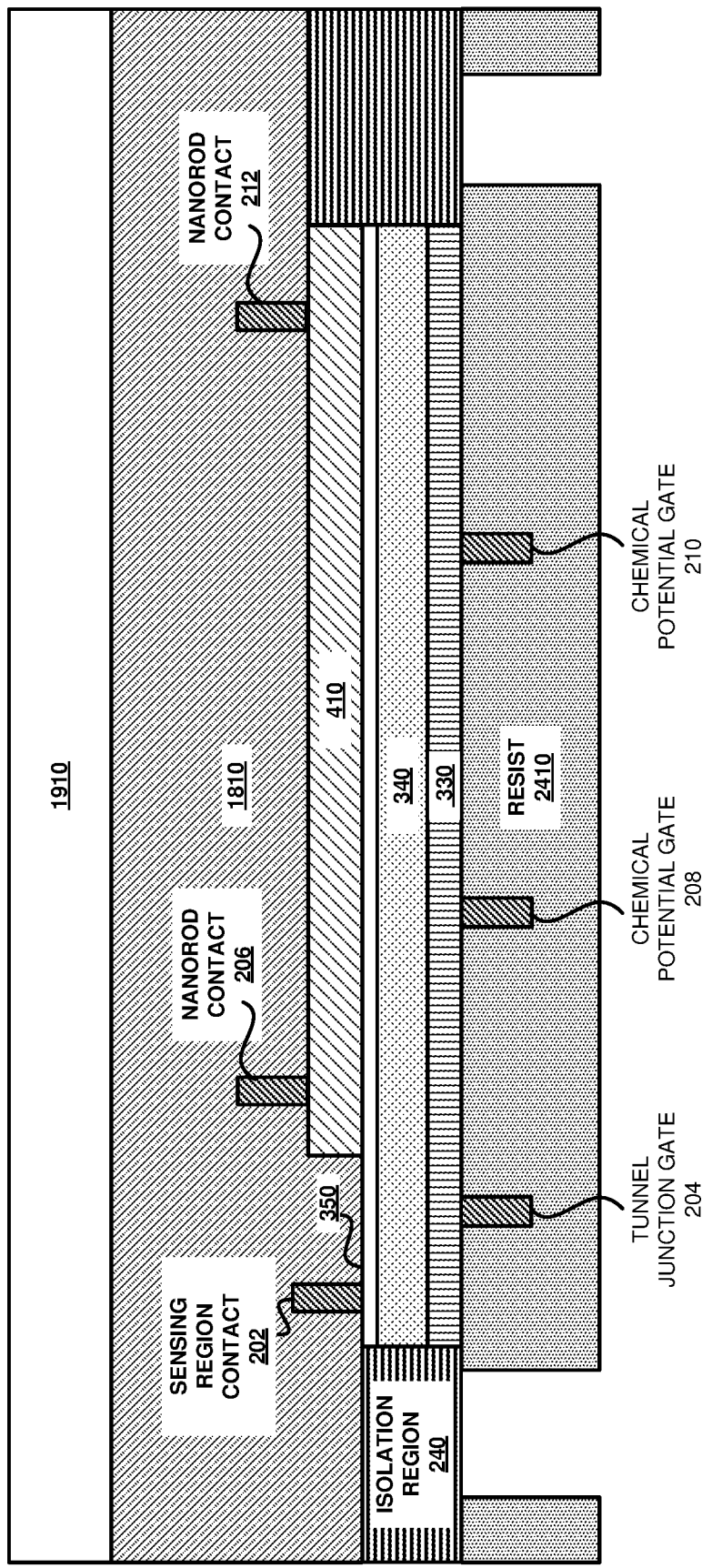
FIG. 24 depicts a block diagram of an example configuration reached in the fabrication of a Majorana fermion quantum computing device in accordance with an illustrative embodiment.

With reference to FIG. 24, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 2400 as described herein. Protective layer 330, semiconductor layer 340, protective layer 350, superconductor layer 410, implant region 710, metal 1610, sensing region contact 202, nanorod contacts 206 and 212, encapsulation film 1810, carrier wafer 1910, metal 2220, tunnel junction gate 204, and chemical potential gates 208 and 210 are the same as protective layer 330, semiconductor layer 340, protective layer 350, superconductor layer 410, implant region 710, metal 1610, sensing region contact 202, nanorod contacts 206 and 212, encapsulation film 1810, carrier wafer 1910, metal 2220, tunnel junction gate 204, and chemical potential gates 208 and 210 in FIG. 23.

An embodiment causes the fabrication system to form resist 2410 on exposed portions of implant region 710, protective layer 330, and tunnel junction gate 204, and chemical potential gates 208 and 210, with openings exposing portions of implant region 710 outside active portions of device 200. Resist 2210 can be formed from any resist material used in lithography, and can be the same or a different material from other resist layers described herein.

Figure 25:
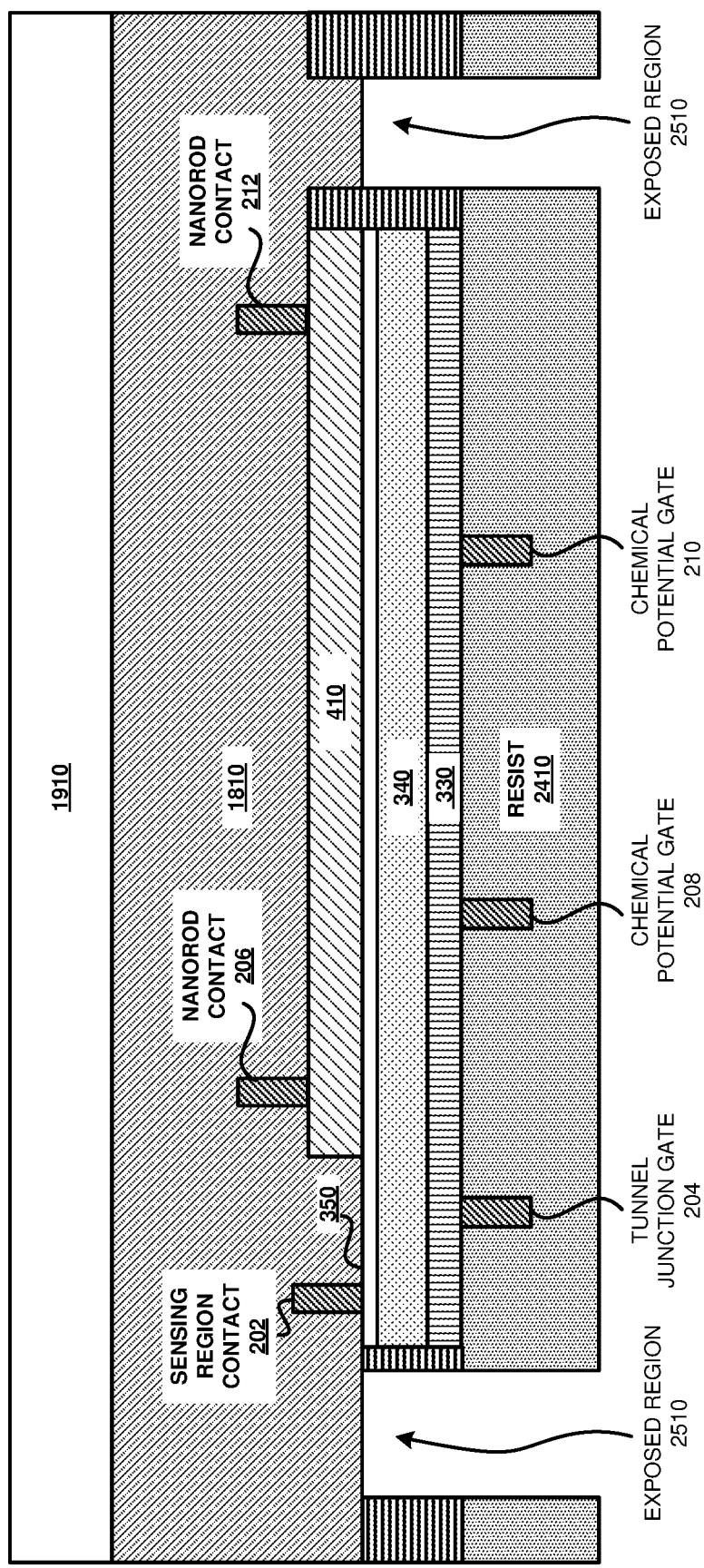
FIG. 25 depicts a block diagram of an example configuration reached in the fabrication of a Majorana fermion quantum computing device in accordance with an illustrative embodiment.

With reference to FIG. 25, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 2500 as described herein. Protective layer 330, semiconductor layer 340, protective layer 350, superconductor layer 410, implant region 710, metal 1610, sensing region contact 202, nanorod contacts 206 and 212, encapsulation film 1810, carrier wafer 1910, metal 2220, tunnel junction gate 204, chemical potential gates 208 and 210, and resist 2410 are the same as protective layer 330, semiconductor layer 340, protective layer 350, superconductor layer 410, implant region 710, metal 1610, sensing region contact 202, nanorod contacts 206 and 212, encapsulation film 1810, carrier wafer 1910, metal 2220, tunnel junction gate 204, chemical potential gates 208 and 210, and resist 2410 in FIG. 24.

An embodiment causes the fabrication system to perform an etching process, removing exposed portions of implant region 710 to create exposed region 2510, allowing access to encapsulation film 1810. The etching process can be the same or a different process as that described elsewhere herein. In one embodiment, the etching process uses RIE.

Figure 26:
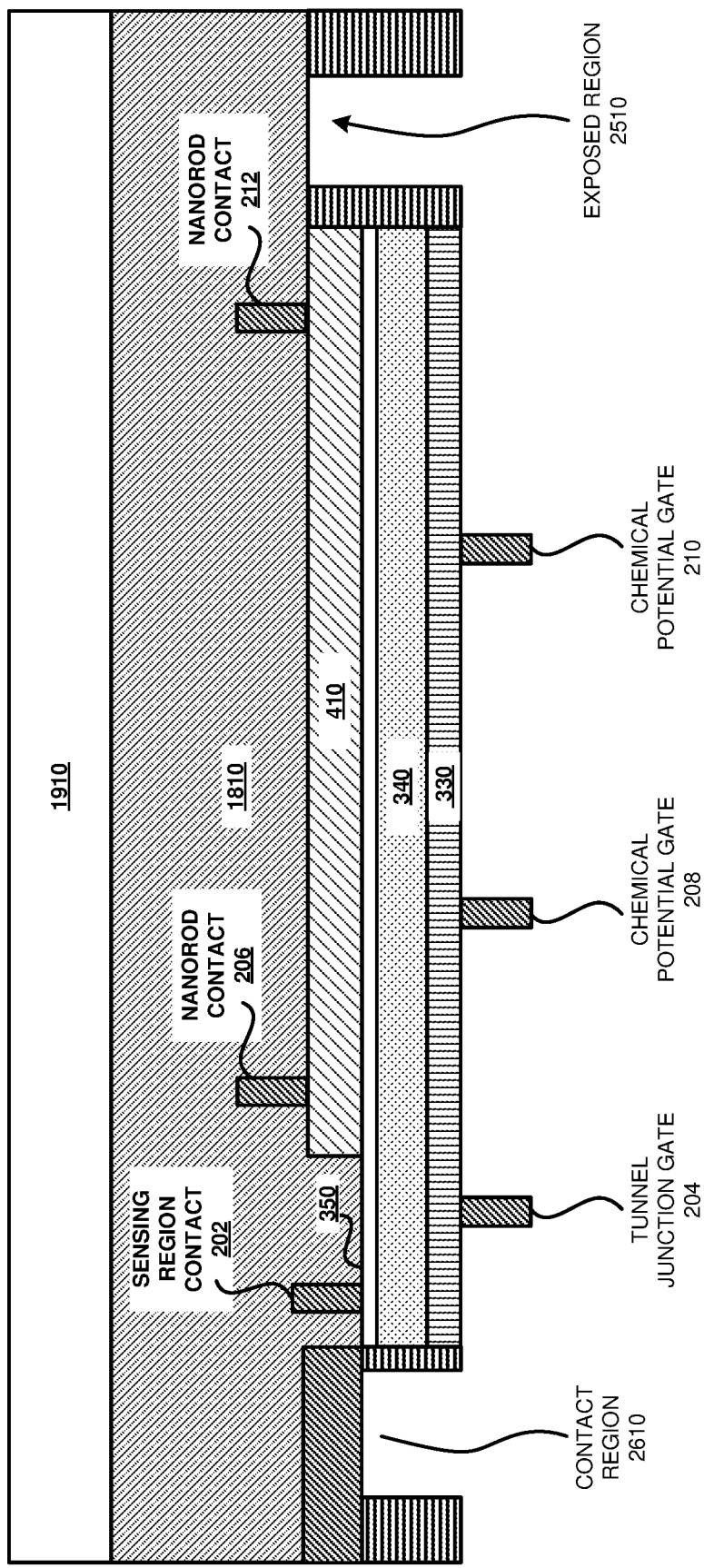
FIG. 26 depicts a block diagram of an example configuration reached in the fabrication of a Majorana fermion quantum computing device in accordance with an illustrative embodiment.

With reference to FIG. 26, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 2600 as described herein. Protective layer 330, semiconductor layer 340, protective layer 350, superconductor layer 410, implant region 710, metal 1610, sensing region contact 202, nanorod contacts 206 and 212, encapsulation film 1810, carrier wafer 1910, metal 2220, tunnel junction gate 204, chemical potential gates 208 and 210, and exposed region 2510 are the same as protective layer 330, semiconductor layer 340, protective layer 350, superconductor layer 410, implant region 710, metal 1610, sensing region contact 202, nanorod contacts 206 and 212, encapsulation film 1810, carrier wafer 1910, metal 2220, tunnel junction gate 204, chemical potential gates 208 and 210, and exposed region 2510 in FIG. 25.

An embodiment causes the fabrication system to form contact region 2610 in some of exposed regions 2510, while leaving others of exposed regions 2510 alone. Contact region 2610 provides electrical coupling to sensing region contact 202, nanorod contacts 206 and 212, and other structures on one surface of device 200. Contact region 2610 is formed of any suitable electrically conductive material, is deposited using any suitable deposition process, and can be the same or a different material from other metal materials described herein.

With reference to FIG. 27, this figure depicts a block diagram of an example configuration reached in the fabrication of a two-sided Majorana fermion quantum computing device in accordance with an illustrative embodiment. Application 105 in FIG. 1 interacts with fabrication system 107 to produce or manipulate configuration 2700 as described herein. Protective layer 330, semiconductor layer 340, protective layer 350, superconductor layer 410, implant region 710, metal 1610, sensing region contact 202, nanorod contacts 206 and 212, encapsulation film 1810, carrier wafer 1910, metal 2220, tunnel junction gate 204, chemical potential gates 208 and 210, and exposed region 2510 are the same as protective layer 330, semiconductor layer 340, protective layer 350, superconductor layer 410, implant region 710, metal 1610, sensing region contact 202, nanorod contacts 206 and 212, encapsulation film 1810, carrier wafer 1910, metal 2220, tunnel junction gate 204, chemical potential gates 208 and 210, and exposed region 2510 in FIG. 25.

An embodiment causes the fabrication system to remove most of encapsulation film 1810 through exposed regions 2510, leaving enough encapsulation film 1810 in areas near superconductor layer 410 to act as a bonding layer with carrier wafer 1910. In embodiments, encapsulation film 1810 is removed with a wet process, for example using water or an organic solvent, or using a mild wet etch or mild plasma etch process. Other removal methods for encapsulation film 1810 are also possible and contemplated within the scope of the illustrative embodiments. Configuration 2700 is a completed form of device 200.

With reference to FIG. 28, this figure depicts a flowchart of an example process for fabricating a Majorana fermion quantum computing device in accordance with an illustrative embodiment. In one or more embodiments, process 2800 is implemented in application 105, which causes a fabrication system, such as fabrication system 107 in FIG. 1 to perform the operations described herein.

In block 2802, the application causes the fabrication system to, on a substrate surface, form in succession a buffer layer, first protective layer, semiconductor layer, and superconductor layer. In block 2804, the application causes the fabrication system to form a first resist pattern defining a device region and a sensing region within the device region on the superconductor layer. In block 2806, the application causes the fabrication system to use an etching process to remove the superconductor layer within the sensing region and expose a region of the underlying semiconductor layer outside the device region unprotected by the first resist pattern. In block 2808, the application causes the fabrication system to implant the exposed region of the semiconductor layer to form an isolation region surrounding the device region. In block 2810, the application causes the fabrication system to use an etching process to expose the sensing region and a portion of the device region of the superconductor layer adjacent to the isolation region. In block 2812, the application causes the fabrication system to form a sensing region gate within the sensing region and a nanorod contact within the portion of the device region outside the sensing region by depositing a metal layer. In block 2814, the application causes the fabrication system to protect the sensing region contact, the nanorod contact, and the superconductor layer with an encapsulation film and a carrier wafer. In block 2816, the application causes the fabrication system to, on an opposite surface of the semiconductor layer from the sensing region gate and the nanorod contact, form a tunnel junction gate within the sensing region and a chemical potential gate within the portion of the device region outside the sensing region by depositing a second metal layer. In block 2818, the application causes the fabrication system to remove a portion of the encapsulation film. Process 2800 then ends.

Various embodiments of the present invention are described herein with reference to the related drawings. Alternative embodiments can be devised without departing from the scope of this invention. Although various connections and positional relationships (e.g., top, bottom, over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A quantum computing device, comprising:
    a device region located on a superconductor layer above a first surface of a semiconductor layer;
    a sensing region located within the device region, the sensing region comprising a portion of the device region including no superconductor layer;
    a sensing region contact comprising a first metal coupled to the first surface of the semiconductor layer within the sensing region;
    a nanorod contact comprising the first metal coupled to the superconductor layer within the portion of the device region outside the sensing region;
    a tunnel junction gate comprising a second metal within the sensing region, the tunnel junction gate disposed on a second surface of the semiconductor layer; and
    a chemical potential gate comprising the second metal within a portion of the device region outside the sensing region, the chemical potential gate disposed on the second surface of the semiconductor layer.

2. The quantum computing device of claim 1, wherein the first device region comprises a first nanorod region, a second nanorod region substantially parallel to the first nanorod region, and the sensing region, the sensing region connecting the first nanorod region and the second nanorod region.

3. The quantum computing device of claim 1, further comprising:
    a buffer layer formed on a first surface of a substrate;
    a first protective layer formed below the second surface of the semiconductor layer; and
    the semiconductor layer formed on the first protective layer.

4. The quantum computing device of claim 3, wherein the buffer layer comprises indium aluminum arsenide.

5. The quantum computing device of claim 3, wherein the first protective layer comprises indium gallium arsenide.

6. The quantum computing device of claim 1, wherein the superconductor layer comprises aluminum.

7. The quantum computing device of claim 1, further comprising:
a second protective layer formed between the first surface of the semiconductor layer and the superconductor layer.

8. The quantum computing device of claim 1, further comprising:
an isolation region surrounding the device region, the isolation region comprising a region in which the superconductor layer has been removed and the semiconductor layer implanted.

9. A computer-implemented method to fabricate a quantum computing device, the method comprising:
forming, on a superconductor layer, a first resist pattern defining a device region and a sensing region within the device region;
removing, using an etching process, the superconductor layer within the sensing region, the etching exposing a region of a first surface of an underlying semiconductor layer outside the device region unprotected by the first resist pattern;
implanting the exposed region of the first surface of the semiconductor layer, the implanting forming an isolation region surrounding the device region;
exposing, using an etching process subsequent to the implanting, the sensing region and a portion of the device region of the superconductor layer adjacent to the isolation region;
forming a sensing region contact by coupling the first surface of the semiconductor layer with a first metal layer;
forming a nanorod contact using the first metal coupled to the superconductor layer within the portion of the device region outside the sensing region; and
forming, by depositing a second metal layer on a second surface of the semiconductor layer within the sensing region, a tunnel junction gate.

10. The computer-implemented method of claim 9, wherein the first device region comprises a first nanorod region, a second nanorod region substantially parallel to the first nanorod region, and the sensing region, the sensing region connecting the first nanorod region and the second nanorod region.

11. The computer-implemented method of claim 9, further comprising:
forming, on a first surface of a substrate, a buffer layer;
forming, on the buffer layer, a first protective layer;
forming, on a first protective layer, the semiconductor layer; and
forming, on the first surface of the semiconductor layer, the superconductor layer.

12. The computer-implemented method of claim 11, wherein the buffer layer comprises indium aluminum arsenide.

13. The computer-implemented method of claim 11, wherein the first protective layer comprises indium gallium arsenide.

14. The computer-implemented method of claim 9, wherein the superconductor layer comprises aluminum.

15. The computer-implemented method of claim 9, further comprising:
forming, between the first surface of the semiconductor layer and the superconductor layer, a second protective layer.

16. The computer-implemented method of claim 9, further comprising:
removing, prior to depositing the first metal layer, the first resist pattern.

17. The computer-implemented method of claim 9, wherein depositing the first metal layer is performed in regions defined by a second resist pattern.

18. The computer-implemented method of claim 9, further comprising, prior to depositing the second metal layer:
protecting the sensing region contact, the nanorod contact, and the superconductor layer using an encapsulation film; and
depositing, above the encapsulation film, a carrier wafer.

19. The computer-implemented method of claim 9, further comprising forming, by depositing the second metal layer on the second surface of the semiconductor layer.

20. A superconductor fabrication system comprising a lithography component, the superconductor fabrication system configured to fabricate a quantum computing device performing operations comprising:
forming, on a superconductor layer, a first resist pattern defining a device region and a sensing region within the device region;
removing, using an etching process, the superconductor layer within the sensing region, the etching exposing a region of a first surface of an underlying semiconductor layer outside the device region unprotected by the first resist pattern;
implanting the exposed region of the first surface of the semiconductor layer, the implanting forming an isolation region surrounding the device region;
exposing, using an etching process subsequent to the implanting, the sensing region and a portion of the device region of the superconductor layer adjacent to the isolation region;
forming a sensing region contact by coupling the first surface of the semiconductor layer with a first metal layer;
forming a nanorod contact using the first metal coupled to the superconductor layer within the portion of the device region outside the sensing region; and
forming, by depositing a second metal layer on a second surface of the semiconductor layer within the sensing region, a tunnel junction gate.

\* \* \* \* \*